United States Patent
Tashiro

[11] Patent Number: 5,990,489
[45] Date of Patent: Nov. 23, 1999

[54] THIN FILM SEMICONDUCTOR APPARATUS AND PRODUCTION METHOD THEREOF

[75] Inventor: Kazuaki Tashiro, Hadano, Japan

[73] Assignee: Canon Kabushiki Kaisha, Tokyo, Japan

[21] Appl. No.: 08/995,880

[22] Filed: Dec. 22, 1997

[30] Foreign Application Priority Data

Dec. 24, 1996 [JP] Japan ................................. 8-343146
Dec. 9, 1997 [JP] Japan ................................. 9-338505

[51] Int. Cl.$^6$ .......................... H01L 29/04; H01L 31/036; H01L 31/0376; H01L 31/20
[52] U.S. Cl. ............................................ 257/53; 257/290
[58] Field of Search ........................................ 257/53, 290

[56] References Cited

U.S. PATENT DOCUMENTS 4,997,773  3/1991  Nobue .
5,306,648  4/1994  Fukaya et al. ................................. 437/3

FOREIGN PATENT DOCUMENTS 0361515   4/1990  European Pat. Off. .
57-59377  4/1982  Japan .
61-172367 8/1986  Japan .
3185868   8/1991  Japan .

*Primary Examiner*—Stephen D. Meier
*Attorney, Agent, or Firm*—Fitzpatrick, Cella, Harper & Scinto

[57] ABSTRACT

For decreasing overlap widths between the gate electrode and the source/drain electrode, a photoelectric conversion apparatus is formed through a step of forming a first conductive layer on a substrate and forming a first electrode pattern therefrom, a step of forming a first insulating layer, a semiconductor layer, and a second insulating layer so as to cover the first electrode pattern, a step of patterning the second insulating layer, and a step of converting a part of a surface of the semiconductor layer into N- or P-conduction type.

15 Claims, 15 Drawing Sheets

THIN FILM SEMICONDUCTOR APPARATUS AND PRODUCTION METHOD THEREOF

BACKGROUND OF THE INVENTION

1. Field of the Invention

The present invention relates to a thin film semiconductor apparatus and a production method thereof and, more particularly, to a thin film semiconductor apparatus having the structure suitable for high performance and large area and a production method of thin film semiconductor apparatus capable of producing it readily and at low cost.

2. Related Background Art

The large-area thin film semiconductor apparatus includes apparatus such as image reading apparatus or image display apparatus in which unit elements are arrayed one-dimensionally or two-dimensionally, and a thin film transistor is a device often used for driving of the apparatus and for reading or writing of information.

This thin film transistor will be first described. The structure of the thin film transistor is assumed to be of the general inverse stagger type. FIGS. 1A–1D, which are illustrated as schematic cross-sectional views, show an example of the structure of the thin film transistor and an example of steps of a production method thereof.

Using a material such as aluminum or chromium, a first conductive layer 602 is deposited on substrate 601 such as a glass substrate by vapor deposition or sputtering (FIG. 1A). This layer is then patterned in a desired shape by photolithography. This forms gate electrode 603 of thin film transistor (FIG. 1B).

Then a gate insulating layer, semiconductor layers, etc. will be deposited on this gate electrode, using the CVD process (Chemical Vapor Deposition) or the like. Specifically, a hydrogenated amorphous silicon nitride film is deposited as gate insulating film 604, using silane ($SiH_4$) gas, ammonia ($NH_3$) gas, and hydrogen ($H_2$) gas. Subsequently, with silane gas and hydrogen gas, an intrinsic hydrogenated amorphous silicon layer is deposited as intrinsic semiconductor layer 605. Further, using silane gas, and phosphine ($PH_3$) gas diluted with hydrogen gas, an $N^+$-type hydrogenated amorphous silicon layer is deposited as impurity semiconductor layer 606. Then a second conductive layer 607 is deposited using the material such as aluminum or chromium by vapor deposition or sputtering (FIG. 1C). Subsequently, it is patterned in a desired shape by photolithography. This is used as a metal layer for the source electrode and drain electrode of thin film transistor. Then an unnecessary portion of the $N^+$-type hydrogenated amorphous silicon layer is removed by dry etching to form ohmic layer to the source electrode and to the drain electrode, thus completing the source electrode and drain electrode 608, 609 (FIG. 1D).

Further, a two-dimensional image reading apparatus is exemplified as a thin film semiconductor apparatus which is a combination of such inverse stagger type thin film transistors with photoelectric conversion elements. FIG. 2A is a schematic plan view of one pixel in the image reading apparatus. FIG. 2B is a schematic, cross-sectional view along 2B—2B of FIG. 2A.

In FIGS. 2A and 2B, numeral 801 designates a substrate, 802 a lower electrode of photoelectric conversion element, 803 a gate electrode, 804 an insulating layer, 805 a semiconductor layer, 806 an ohmic layer (ohmic contact layer), 807 a drain electrode, 808 a source electrode, and 809 an insulating, protective layer. Further, S11 represents the photoelectric conversion element (an MIS type photosensor in this example), T11 the thin film transistor (TFT), SIG a signal line, g1 a gate driving line, and $V_1$ a power source line. In FIG. 2A the insulating layer 804, ohmic layer 806, and protective layer 809 are not illustrated in order to avoid complexity of illustration, and the semiconductor layer 805 is illustrated by a solid line.

As illustrated, the photoelectric conversion element S11 has the structure in which the lower electrode 802, insulating layer 804, semiconductor layer 805, and ohmic layer 806 are stacked in the stated order on the substrate 801. The ohmic layer 806 has a function as an upper electrode of the photoelectric conversion element S11. The photoelectric conversion element S11 has the insulating layer 804 and semiconductor layer 805 between the ohmic layer 806 and the lower electrode 802 becoming the upper and lower electrodes, thereby composing the MIS type structure.

The thin film transistor has the gate electrode 803 on the substrate 801, and has the insulating layer 804 becoming a gate insulating film, and the semiconductor layer 805 in this order thereon. The ohmic layer 806 is formed on the semiconductor layer 805 with a space forming a channel region corresponding to the gate electrode 803, and through this ohmic layer 806 the transistor has a conductive material, for example a metal such as aluminum, as source and drain electrodes 808, 807.

The lower electrode 802 is formed so as to extend from the power source line $V_1$, the gate electrode 803 from the gate driving line g1, and the drain electrode 807 from the signal line SIG, respectively.

In the drawing numeral 806 on the photoelectric conversion element S11, being the MIS type photosensor, is an $N^+$-type hydrogenated amorphous silicon layer and functions as a window layer. This $N^+$-type hydrogenated amorphous silicon layer also functions as an injection preventing layer (a blocking layer), as well as functioning as an electrode layer as described above.

FIG. 3 shows an equivalent circuit of one pixel of this image reading apparatus. One pixel has an MIS type photosensor S11 and a thin film transistor T11 for transmission of signal. Letters D, G indicate the upper electrode (the ohmic layer 806 in this example) and the lower electrode 802, respectively, of the MIS type photosensor. Symbols Cgs, Cgd represent capacitors formed by overlap between the gate electrode 803 and the source electrode 808 and overlap between the gate electrode 803 and the drain electrode 807 ($d_1$, $d_2$ in FIG. 1D) of the thin film transistor, and Vs stands for a power source. The charge created in the MIS type photosensor S11 by light is stored through the thin film transistor T11 in the capacitors Cgs, Cgd, and thereafter this charge is read out by a reading circuit not illustrated. This is a case of one bit, but, in practice, these Cgs, Cgd are added to those of the other thin film transistors connected to this gate line. In this way storage capacitors make use of Cgs, Cgd.

The thin film transistor and photoelectric conversion element both can be produced by the same layer-forming process and both have the MIS (Metal Insulator Semiconductor) type structure having the electrode on the lower side.

An example of drive of the above-stated MIS type photosensor will be described below, using the schematic energy band diagrams shown in FIG. 4A and FIG. 4B.

FIG. 4A is a schematic energy band diagram of the photoelectric conversion element to show the action in a refresh mode and FIG. 4B the action in a photoelectric conversion mode. In FIG. 4A numerals 1 to 5 correspond to the drain electrode 807, the ohmic layer 806, the semiconductor layer 805, the insulating layer 804 and the lower electrode 802, respectively. Accordingly, the diagrams show the states along the direction of the layer thickness. In the refresh mode the D electrode has a negative potential relative to the G electrode and, therefore, holes indicated by black dots in the intrinsic (intrinsic or substantially intrinsic) hydrogenated amorphous silicon layer 3, which is, for example, the semiconductor layer 805, are guided into the D electrode by an electric field. At the same time as it, electrons indicated by white circles are injected into the intrinsic hydrogenated amorphous silicon layer 3. At this time some holes and electrons are recombined in the $N^+$-type hydrogenated amorphous silicon layer 2, which is, for example, the ohmic layer 806, and in the intrinsic hydrogenated amorphous silicon layer 3 to annihilate. After a lapse of a sufficiently long period of time, the holes in the intrinsic hydrogenated amorphous silicon layer 3 will be swept out of the intrinsic hydrogenated amorphous silicon layer 3 (FIG. 4A). When the mode is switched from this state into the photoelectric conversion mode, the D electrode will be provided with a positive potential relative to the G electrode and, therefore, the electrons in the intrinsic hydrogenated amorphous silicon layer 3 are instantaneously guided into the D electrode. However, since the $N^+$-type hydrogenated amorphous silicon layer 2 acts as an injection preventing layer, holes are prevented from being injected from the D electrode into the intrinsic hydrogenated amorphous silicon layer 3. When in this state light is incident into the intrinsic hydrogenated amorphous silicon layer 3, the light is absorbed to create an electron-hole pair. This electron is guided into the D electrode by the electric field and the hole moves in the intrinsic hydrogenated amorphous silicon layer 3 to reach the interface to the hydrogenated amorphous silicon nitride film 4, which is, for example, the insulating layer 804. At this point the movement of the hole is blocked, so that the hole will remain in the intrinsic hydrogenated amorphous silicon layer 3. At this time the electron moves into the D electrode while the hole moves to the interface to the hydrogenated amorphous silicon nitride layer 4 in the intrinsic hydrogenated amorphous silicon layer 3. Therefore, an electric current flows from the G electrode in order to keep the electrical neutrality in the element. Since this electric current corresponds to the electron-hole pair created by the light, the electric current is proportional to the incident light.

FIG. 5 shows an example of a schematic circuit diagram of the whole of the image reading apparatus. Photoelectric conversion elements S11 to S33, thin film transistors T11 to T33 for driving, wirings, etc. are of the structure as described above, whereby they can be formed on the same substrate, using the layers formed by the same process. Vs represents a power source for reading and Vg a power source for refresh. Each power source Vs, Vg is connected through switch SWs, SWg to the lower electrodes G of the all photoelectric conversion elements S11 to S33. The switch SWs is connected through an inverter to a refresh control circuit RF while the switch SWg directly to the refresh control circuit RF. The switches are controlled in such a manner that the switch SWg is on during a refresh period and the switch SWs is on during the other periods. Signal outputs are connected to an integrated circuit for detection IC by signal lines SIG. In FIG. 5 nine pixels are arranged in three blocks, outputs of three pixels per block are transferred at one time, and the detection integrated circuit successively converts the signals into outputs to output them. Although this example shows the two-dimensional image input section of nine pixels for easier description, the image input section is practically constructed in the structure of higher density of pixels. For example, supposing the pixel size is 150 $\mu$m square and the image reading apparatus is constructed in the size of 40 cm square, the number of pixels is approximately 1,800,000.

An example of production steps of the above image reading apparatus is shown in FIGS. 6A–6F.

1. On clean glass substrate 801 after cleaned, chromium is deposited in the thickness of 1000 Å by sputtering. A pattern of photoresist is formed in a desired shape on this chromium layer. Etching is conducted with this photoresist pattern as a mask. After that, the photoresist is peeled off and the substrate is cleaned, thereby forming the gate electrodes 803 of thin film transistor of each pixel, lower electrodes 802 of MIS type photosensor, and wiring portions. (FIG. 6A)

2. On this substrate a hydrogenated amorphous silicon nitride layer to become the insulating layer 804 is then formed by the plasma enhanced CVD using silane ($SiH_4$) gas, ammonia ($NH_3$) gas, and hydrogen ($H_2$) gas. Subsequently, an intrinsic hydrogenated amorphous silicon layer to become the semiconductor layer 805 is formed by the plasma enhanced CVD using silane ($SiH_4$) gas and hydrogen ($H_2$) gas. Further, an $N^+$-type hydrogenated amorphous silicon layer to become the ohmic layer 806 is formed by the plasma enhanced CVD using silane ($SiH_4$) gas, phosphine ($PH_3$) gas, and hydrogen ($H_2$) gas. (FIG. 6B)

3. A photoresist pattern for contact holes and isolation is produced by photolithography and with this photoresist pattern as a mask dry etching is carried out to remove parts of the insulating layer 804 (hydrogenated amorphous silicon nitride layer), semiconductor layer 805 (intrinsic hydrogenated amorphous silicon layer), and ohmic layer 806 ($N^+$-type hydrogenated amorphous silicon layer). Then the photoresist is peeled off and the substrate is cleaned, thus achieving formation of contact holes (not illustrated) and isolation. (FIG. 6C)

4. Aluminum is deposited in the thickness of 1 $\mu$m thereon by sputtering. After that, a photoresist pattern is formed in a desired shape on the aluminum layer. Using this photoresist pattern as a mask, etching is carried out. Then the photoresist is peeled off and the substrate is cleaned, thus obtaining the source electrodes 808 of thin film transistors, the drain electrodes 807 of thin film transistors, and electrodes of wiring portions. At this time the aluminum layer on the MIS type photosensor is removed, and in this example the $N^+$-type hydrogenated amorphous silicon layer being the ohmic layer 806 is utilized as a window layer and as upper electrodes. (FIG. 6D)

5. Subsequently, a photoresist pattern is formed in a desired shape on this aluminum pattern and with this pattern as a mask, etching is carried out of only the $N^+$-type hydrogenated amorphous silicon layer of the ohmic layer 806 in channel portions of thin film transistors corresponding to portions between the source electrodes 808 and the drain electrodes 807. Then the photoresist is peeled off and the substrate is cleaned, thus forming the channels. (FIG. 6E)

6. Subsequently, a hydrogenated amorphous silicon nitride layer is formed as the surface protective layer 809 in the thickness of 6000 Å by the plasma enhanced CVD using silane ($SiH_4$) gas, ammonia ($NH_3$) gas, and hydrogen ($H_2$) gas.

In the thin film transistor described above, the overlap widths $d_1$, $d_2$ of 2 to 3 $\mu$m are necessary between the gate electrode 603 and the source or drain electrode 608, 609, as shown in FIG. 1D. This results from the limitation of accuracy of alignment in forming the photoresist pattern for the source and drain electrodes in the production method as described above. Namely, redundancy is given to alignment so that deviation of alignment will not degrade the function of TFT. In the portions of the overlap widths, however, the capacitor Cgs is formed between the gate electrode and the source electrode and the capacitor Cgd between the gate electrode and the drain electrode.

The capacitors Cgs, Cgd of thin film transistor sometimes cause various negative effects. For example, the capacitors delay the response of thin film transistor to the gate voltage. Specifically, when the charge of each pixel is read out, the voltage is successively applied to the gate electrodes of thin film transistors for transmission in the respective pixels to turn each gate on, thereby transferring the stored charge. The response to the gate voltage at this time is defined by resistance R of gate wiring and capacitances of the capacitors Cgs, Cgd. This sometimes raised the problem that the image reading apparatus failed to follow high-speed switching operation for operating the whole apparatus, for example, in a mode compatible with moving picture. The capacitors often have too large capacitances relative to signal amounts to be used as storage capacitors. Therefore, even a small output needs to be read out, and a very low noise IC is necessary for reading, posing the problem of increase in the loads on the IC. Since the capacitances of the capacitors are large at present, it is inevitable to use the capacitors as read capacitors. This sometimes results in narrowing the design margin. If the capacitances of the capacitors are decreased to a low level, the optimum read capacitor can be designed separately without using the capacitors. By placing this capacitor immediately before reading of IC, the loads on the IC can be decreased.

When such thin film transistors with the capacitors Cgs, Cgd are used for driving and for reading of one-dimensional or two-dimensional sensors arrayed in a matrix, these capacitors often become parasitic capacitances to cause crosstalk or the like in reading of signal and to negatively affect the operation.

Therefore, efforts have been made to eliminate the overlap widths by the so-called self-alignment (self-aligning) process for the single thin film transistor. An example thereof is shown in FIGS. 7A–7F to show schematic step diagrams for explaining an example of the production technology of self-alignment. It will be described referring to FIGS. 7A–7F.

On glass substrate 701, a first conductive layer 702 is first deposited using a material such as aluminum or chromium by vapor deposition or sputtering. Subsequently, it is patterned in a desired shape by photolithography. This is used as gate electrode 703 of thin film transistor.

Then a gate insulating film, semiconductor layers, etc. will be deposited on this gate electrode by the CVD process (Chemical Vapor Deposition) or the like. A hydrogenated amorphous silicon nitride film is first deposited as gate insulating film 704, using silane ($SiH_4$) gas, ammonia ($NH_3$) gas, and hydrogen ($H_2$) gas. Subsequently, an intrinsic hydrogenated amorphous silicon layer is deposited as intrinsic semiconductor layer 705 with silane gas and hydrogen gas. Further, an $N^+$-type hydrogenated amorphous silicon layer is deposited as impurity semiconductor layer 706, using silane gas, and phosphine gas diluted with hydrogen gas. The technology of self-alignment is realized by improving the exposure method in photolithography upon formation of source electrode and drain electrode. Namely, photoresist 707 is formed on the $N^+$-type hydrogenated amorphous silicon layer 706. This photoresist is subject to back exposure from the back side of substrate, using the gate electrode 703 formed in the desired shape, as a mask. By this step the photoresist pattern 708 is formed in the same width as that of the gate electrode. After this, while keeping this photoresist pattern there, a second conductive layer 709 is deposited using the material such as aluminum or chromium by vapor deposition or sputtering. Then a stripping step of the photoresist is carried out. This causes the photoresist pattern on the gate electrode to be lifted off, whereupon the metal layer is left in the source electrode and drain electrode portions to form the source and drain electrodes. Subsequently, with the metal layer of the source electrode and drain electrode as a mask, dry etching is carried out to remove unnecessary portions of the $N^+$-type hydrogenated amorphous silicon layer to form the ohmic layer to the source electrode and to the drain electrode, thereby completing the source electrode and drain electrode 710, 711 having reduced overlap widths with the gate electrode.

However, since this method employs the back exposure, the second conductive layer of the light-shielding property must be formed after the exposure, and the lift-off method is unavoidable. The step of forming the source electrode and drain electrode by the lift-off takes place at the same time as stripping of the photoresist pattern on the gate electrode in the development step. In some cases cross sections of the source and drain electrodes were not always formed in self-alignment fashion (self-aligning manner) with respect to the gate electrode, contrary to expectation. There sometimes arose the problem that the step of forming the second conductive layer with the photosensitive resist kept remaining was likely to be the cause of decrease in the yield, because of development failure caused by deterioration of the photoresist by a high-temperature step (150 to 200° C.).

In order to avoid the lift-off step, it is also possible to use a transparent conductive, e.g. ITO (Indium Tin Oxide), for the second conductive layer in such manner as to form the conductive material on the $N^+$-type hydrogenated amorphous silicon layer 706, then form a negative photoresist thereon, remove non-irradiated portions while leaving the resist only in irradiated portions, and etch the removed portions. By using the negative photoresist, the photoresist pattern except for the channel portion can be formed in the self-aligning manner with respect to the gate electrode, but, in applications of this thin film transistor for driving or for reading of one-dimensional or two-dimensional image reading apparatus in which such transistors are arrayed in a matrix, the wiring resistance is increased by the ITO wirings, which could cause difficulties in driving. Thus, it is not preferable.

In applications wherein the thin film transistors were combined with other devices, the above-stated self-aligning process had the improvable points as described above.

SUMMARY OF THE INVENTION

In view of the technology described above, an object of the present invention is to propose a self-alignment technique using cheap materials and very easy processes on one hand while, speaking of the example of the thin film transistor, being capable of minimizing the overlap widths between the gate electrode and the source/drain electrode on the other hand, and to provide a production method for producing a thin film semiconductor apparatus, even a large-area thin film semiconductor apparatus, readily and with high quality and at low cost.

Another object of the present invention is to provide a thin film semiconductor apparatus being operable at high speed, for example being capable of acquiring moving picture, and having excellent photoelectric conversion characteristics, and to provide a production method thereof.

An object of the present invention is to provide a thin film semiconductor apparatus comprising a photoelectric conversion element having a first electrode, an insulating layer, a semiconductor layer, and a second electrode in the stated order on a substrate; and a thin film transistor having a semiconductor layer on an insulating layer provided on the substrate, a pair of ohmic contact layers disposed with a space on the semiconductor layer, source and drain electrodes provided in contact with the respective ohmic contact layers, and a gate electrode provided through a second insulating layer in the space.

A further object of the present invention is to provide a method for producing a thin film semiconductor apparatus having a photoelectric conversion element and a thin film transistor, the method comprising a step of forming a first conductive layer on a substrate and forming a first electrode pattern from the conductive layer; a step of forming a first insulating layer, a semiconductor layer, and a second insulating layer so as to cover the first electrode pattern; a step of patterning the second insulating layer; and a step of forming an ohmic contact layer in correspondence to the second insulating layer thus patterned.

In the above apparatus, the second electrode may be the ohmic contact layer.

In the above apparatus the insulating layer of the photoelectric conversion element and the insulating layer of the thin film transistor may be a common insulating layer.

Further, in the above apparatus the insulating layer of the thin film transistor may extend from the insulating layer of the photoelectric conversion element.

In the above apparatus a width of the second insulating layer of the thin film transistor may be wider than a width of the gate electrode.

In addition, in the above apparatus the second insulating layer may be provided on a second semiconductor formed on the semiconductor layer.

In the above apparatus the second semiconductor may be a polycrystalline semiconductor.

In the above apparatus the semiconductor layer may be an amorphous semiconductor and the second semiconductor may be a polycrystalline semiconductor.

Further, in the above apparatus the ohmic contact layer may comprise an impurity capable of controlling a conduction type of semiconductor.

In addition, in the above apparatus the second electrode of the photoelectric conversion element may be electrically connected with one of the source and drain electrodes of the thin film transistor; and the second electrode of the photoelectric conversion element may extend from the ohmic contact layer of the thin film transistor.

The above method may further comprise a step of forming a gate electrode on the second insulating layer thus patterned, prior to formation of the ohmic contact layer.

Further, the above method may comprise a step of providing a conductive layer on the ohmic contact layer after formation of the ohmic contact layer and thereafter patterning the conductive layer.

Further, in the above method, the step of forming the ohmic contact layer may be carried out in such a state that a resist material is held on the second insulating film in correspondence to the gate insulating film of the thin film transistor.

In the above method, preferably, the semiconductor layer may be an amorphous semiconductor, and the method may further comprise a step of polycrystallizing at least a part of a surface side of the semiconductor, after formation of the semiconductor layer.

In addition, in the above method the step of forming the ohmic contact layer may be carried out by introducing a substance for controlling a conduction type into a polycrystalline semiconductor.

DESCRIPTION OF THE PREFERRED EMBODIMENTS

The embodiments of the present invention will be described in detail by reference to the drawings.

Embodiment 1

Figure 8A:
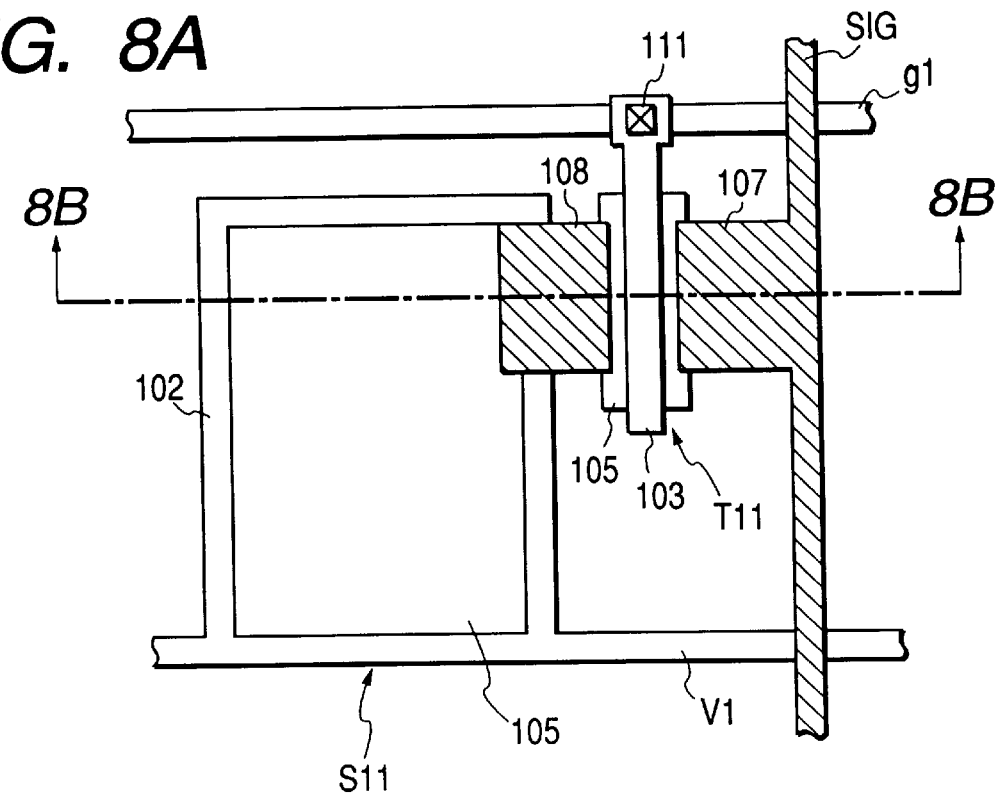
FIG. 8A is a schematic plan view for explaining an example of the structure of one pixel in a photoelectric conversion apparatus.
Figure 8B:
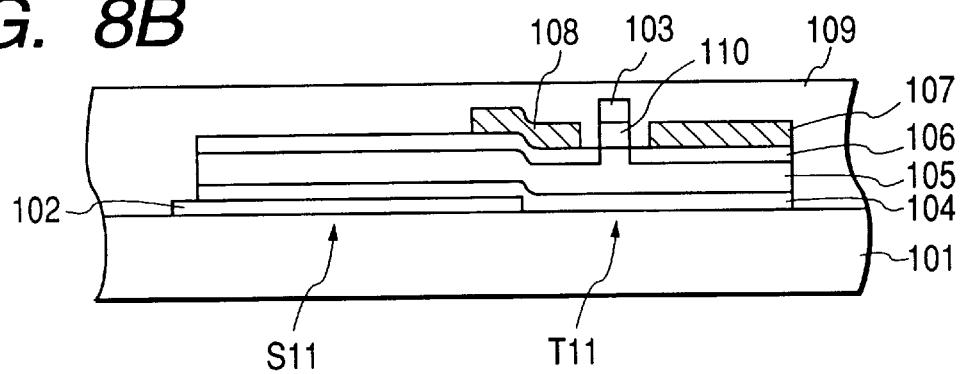
FIG. 8B is a schematic, cross-sectional view for explaining an example of the structure of one pixel in the photoelectric conversion apparatus.
Figure 9:
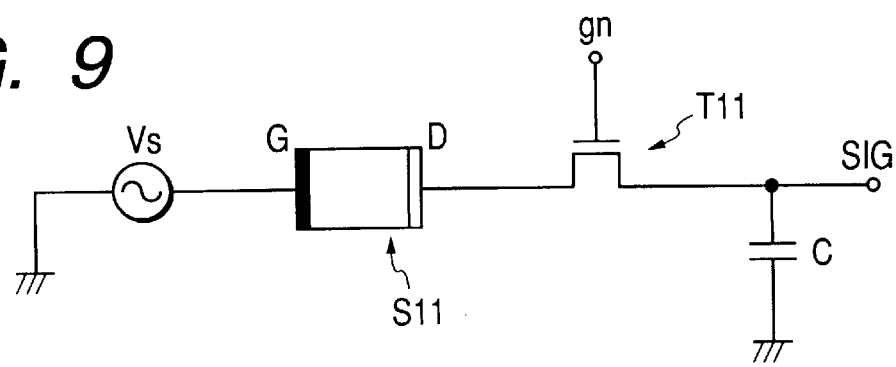
FIG. 9 is a schematic, equivalent circuit diagram corresponding to one pixel.
Figure 10A:
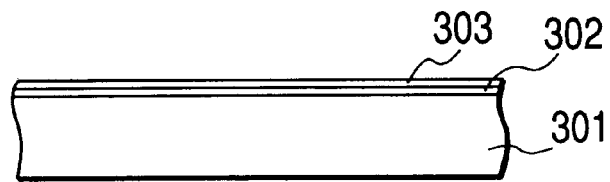
FIGS. 10A, 10B, 10C, 10D, 10E, 10F, 10G, 10H, 10I, 10J and 10K are schematic, cross-sectional views for explaining an example of production steps of the photoelectric conversion apparatus.
Figure 10B:
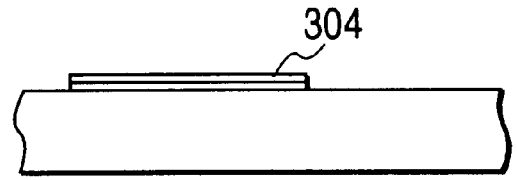
Figure 10C:
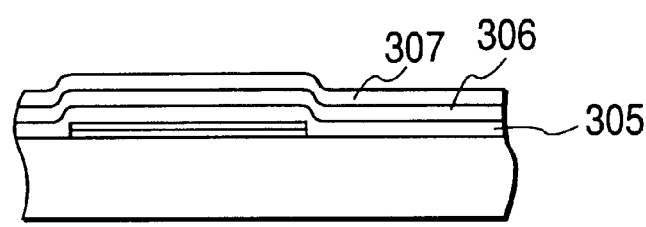
Figure 10D:
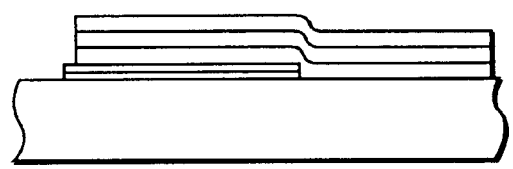
Figure 10E:
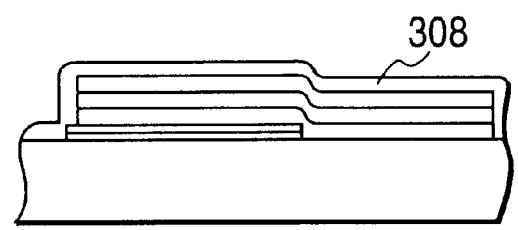
Figure 10F:
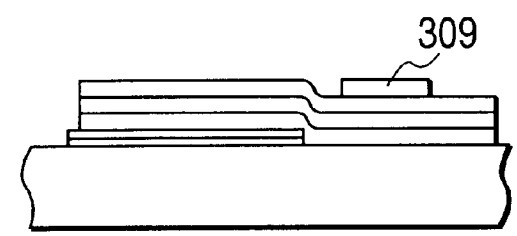
Figure 10G:
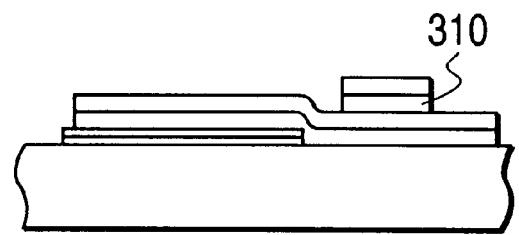
Figure 10H:
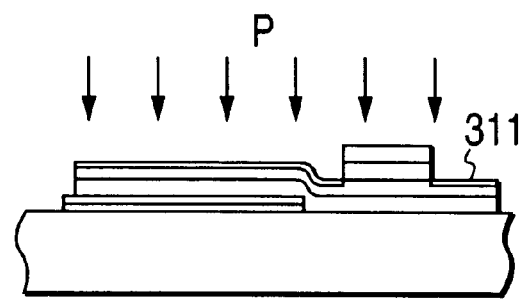
Figure 10I:
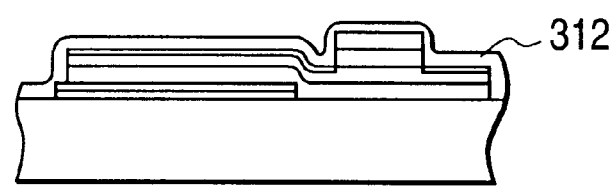
Figure 10J:
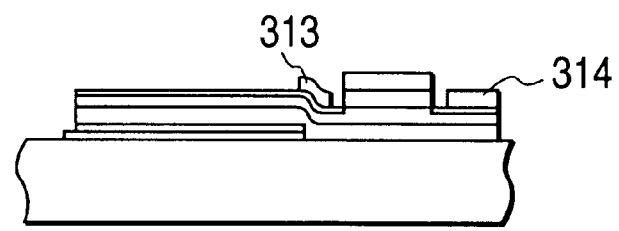
Figure 10K:
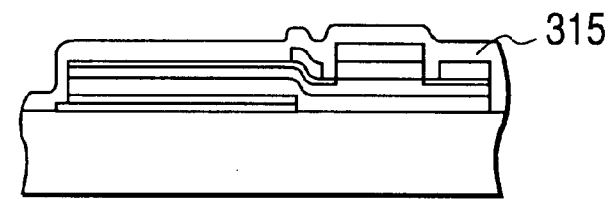

A two-dimensional image reading apparatus will be exemplified as a thin film semiconductor apparatus of the present invention and will be described hereinafter. FIG. 8A is a schematic plan view of one pixel of the image reading apparatus according to the present invention. FIG. 8B is a schematic, cross-sectional view along 8B—8B of FIG. 8A. FIG. 9 shows an equivalent circuit of one pixel of this image reading apparatus.

In FIGS. 8A, 8B, numeral 101 designates a glass substrate, a transparent member, or a substrate at least the surface of which is electrically insulative, and 102 a lower electrode of photoelectric conversion element S11, which is made of an electrically conductive material such as a metal. Numeral 104 denotes an insulating layer typified by silicon nitride or silicon oxide, and 105 a semiconductor layer which is made of a nonmonocrystalline semiconductor, for example, typified by amorphous silicon or polycrystalline silicon. Numeral 106 represents an ohmic layer which is made of a semiconductor containing impurities capable of controlling the conduction type of the semiconductor. The semiconductor for the ohmic layer 106 can be normally selected from nonmonocrystalline semiconductors typified by $N^+$-type amorphous silicon and $N^+$-type polycrystalline silicon. Numeral 103 designates a gate electrode of thin film transistor (TFT) T11, 107 a source electrode of TFT T11, and 108 a drain electrode of TFT T11. A conductive material such as a metal may be used for such electrodes. Numeral 110 denotes a gate insulating film of TFT T11, which can be made of an insulating material, for example such as silicon nitride or silicon oxide. Numeral 109 stands for a protective layer, which can be made suitably of an insulating material such as silicon nitride or silicon oxide. Numeral 111 represents a contact portion for electrically connecting the gate line g1 with the gate electrode 103 by making use of a contact hole.

As shown in FIGS. 8A and 8B, the photoelectric conversion element S11 has the stacked structure having the lower electrode 102, insulating layer 104, semiconductor layer 105, and ohmic layer 106 in this order on the substrate 101.

The thin film transistor T11 has the semiconductor layer 105 on the insulating layer 104 provided on the substrate 101, the ohmic layer 106 consisting of regions with a space in between on the semiconductor layer 105, the source and drain electrodes 108, 107 provided each in contact with the respective regions of ohmic layer 106, and the gate electrode 103 provided through the gate insulating film 110 in the space.

As shown in FIGS. 8A and 8B, one pixel is composed of a lower MIS type (lower metal electrode type) photosensor S11 and an upper MIS type (upper gate electrode type) thin film transistor T11 for transmission of signal. This structure realizes coexistence of the upper MIS type thin film transistor and lower MIS type photosensor by utilizing the common semiconductors while forming the insulating layer and semiconductor layer by common processes.

Figure 1A:
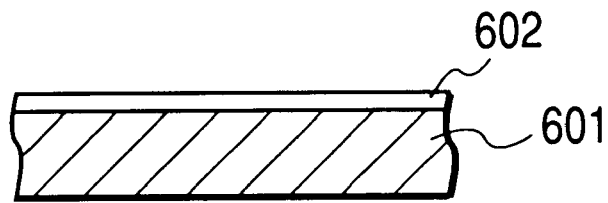
FIGS. 1A, 1B, 1C and 1D are schematic, cross-sectional views for explaining an example of the production steps of a thin film transistor.
Figure 1B:
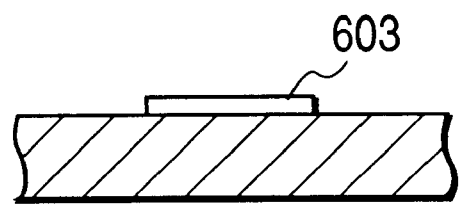
Figure 1C:
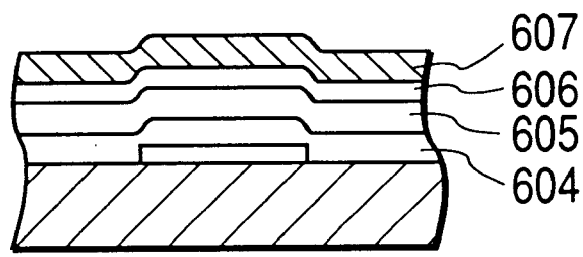
Figure 1D:
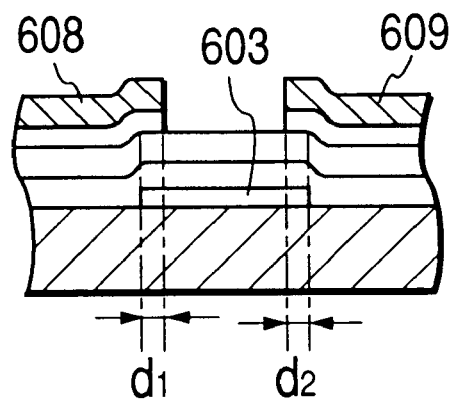
Figure 2A:
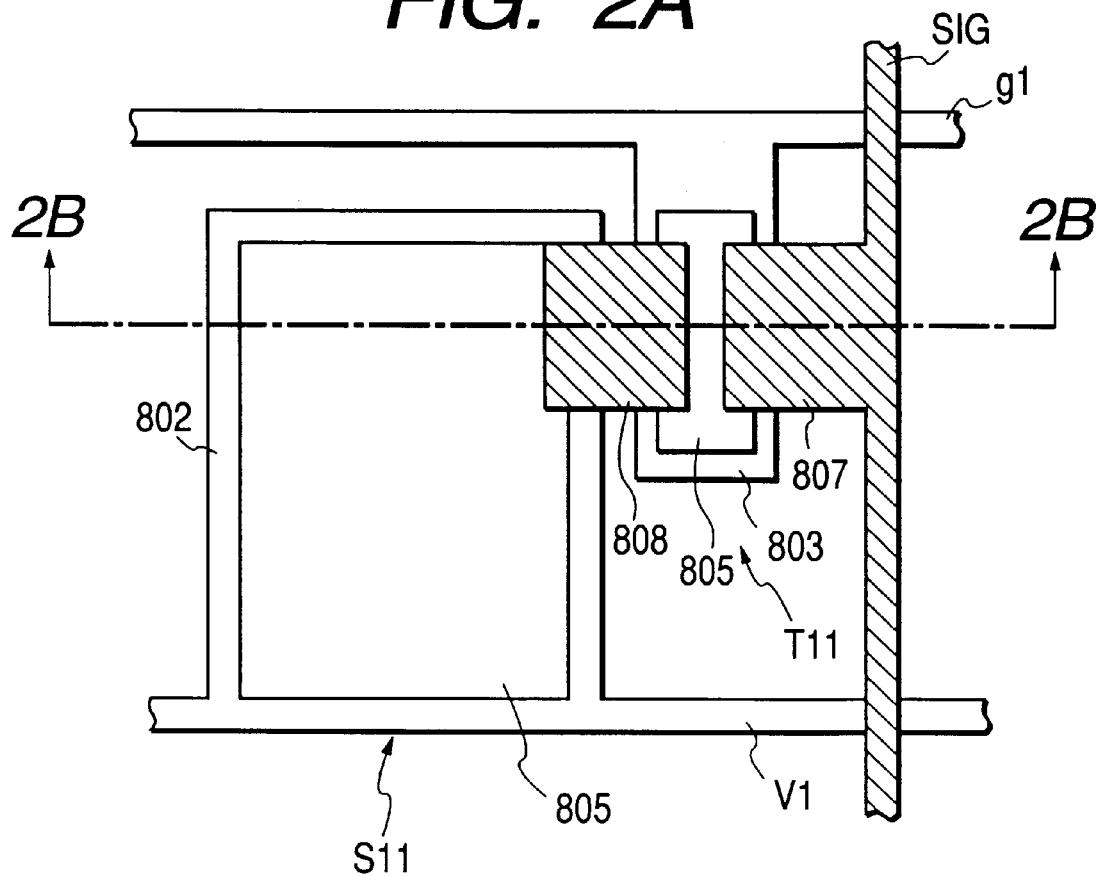
FIG. 2A is a schematic plan view for explaining an example of the structure of one pixel in a photoelectric conversion apparatus.
Figure 2B:
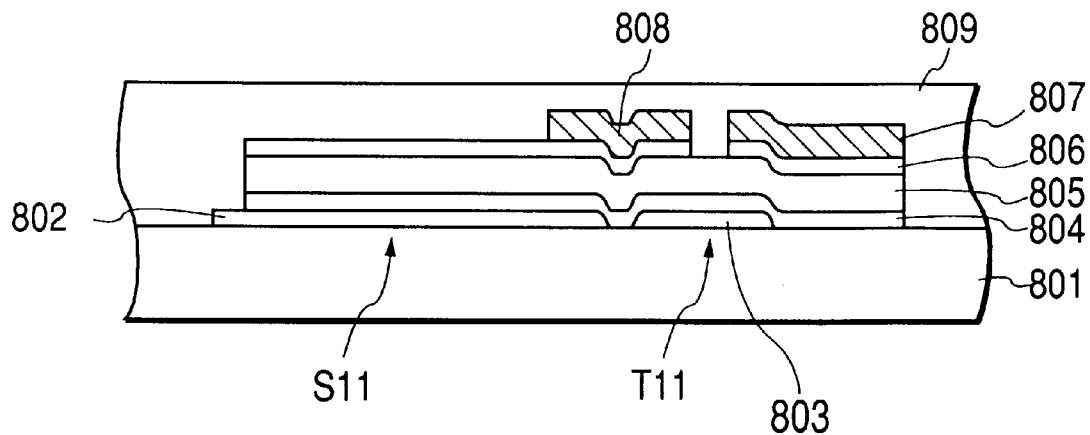
FIG. 2B is a schematic, cross-sectional view for explaining an example of the structure of one pixel in the photoelectric conversion apparatus.
Figure 3:
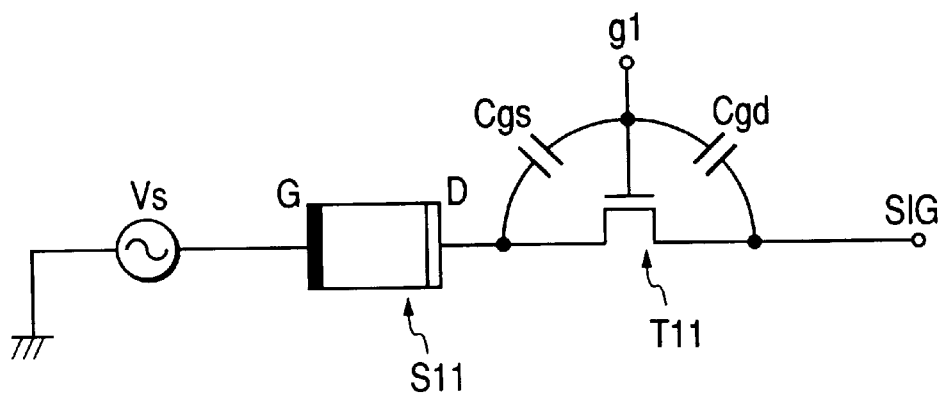
FIG. 3 is a schematic, equivalent circuit diagram corresponding to one pixel.
Figure 4A:
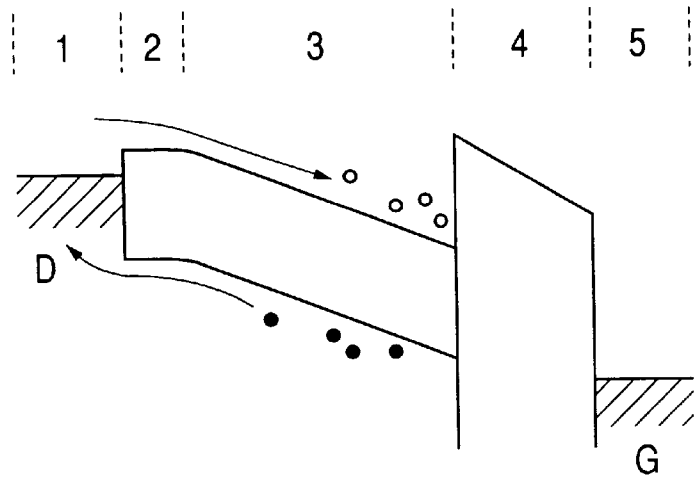
FIG. 4A and FIG. 4B are schematic energy band diagrams for explaining an example of driving of the photoelectric conversion element.
Figure 4B:
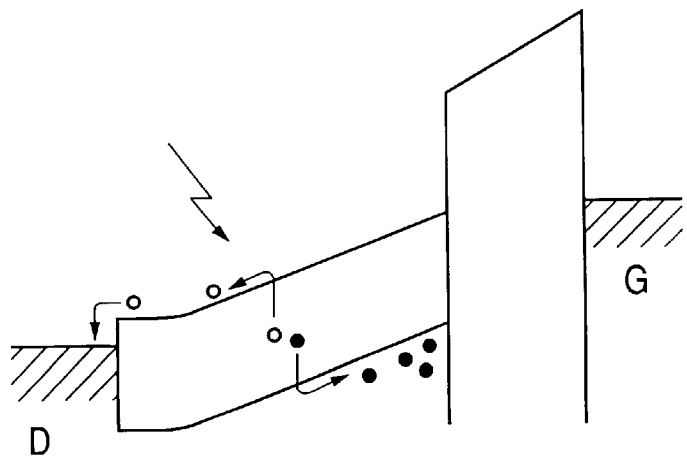

The elements with the same reference symbols as those used in FIGS. 2A, 2B, and FIG. 3 denote the same elements.

The operation of the photoelectric conversion element S11 is as described previously.

Figure 5:
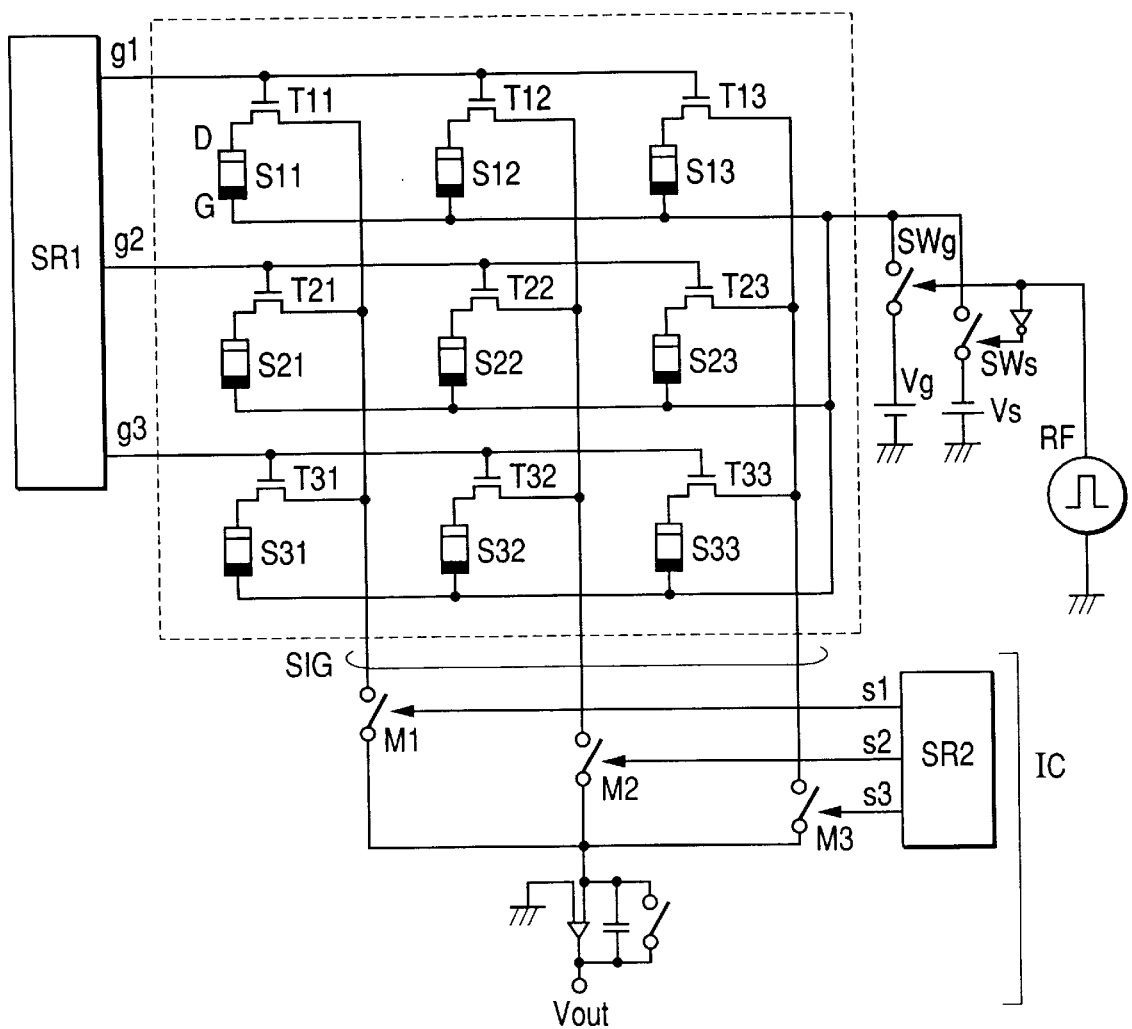
FIG. 5 is a schematic, equivalent circuit diagram of the photoelectric conversion apparatus.
Figure 6A:
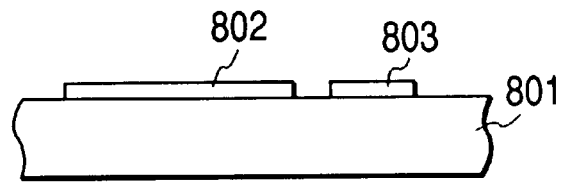
FIGS. 6A, 6B, 6C, 6D, 6E and 6F are schematic, cross-sectional views for explaining an example of production steps of a photoelectric conversion apparatus.
Figure 6B:
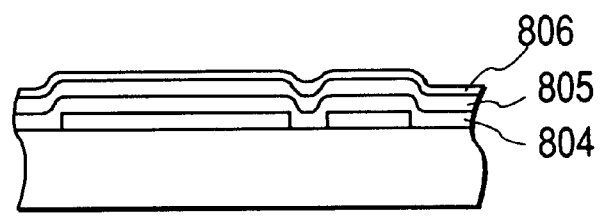
Figure 6C:
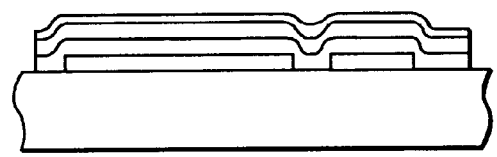
Figure 6D:
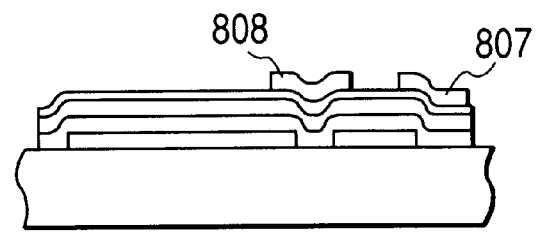
Figure 6E:
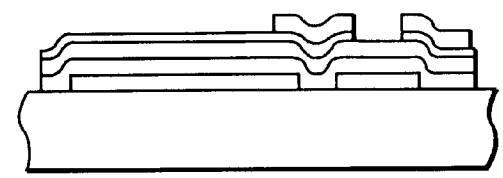
Figure 6F:
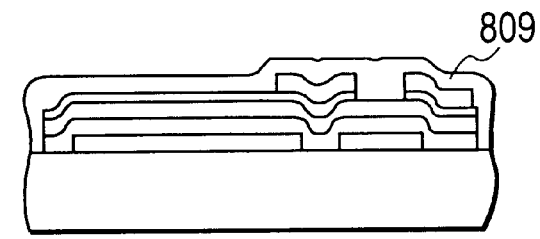
Figure 7A:
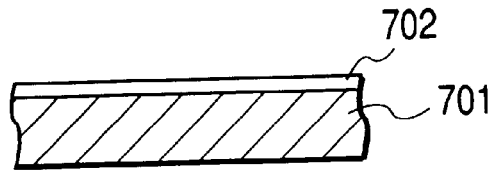
FIGS. 7A, 7B, 7C, 7D, 7E and 7F are schematic, cross-sectional views for explaining an example of production steps of a thin film transistor.
Figure 7B:
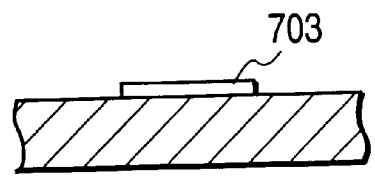
Figure 7C:
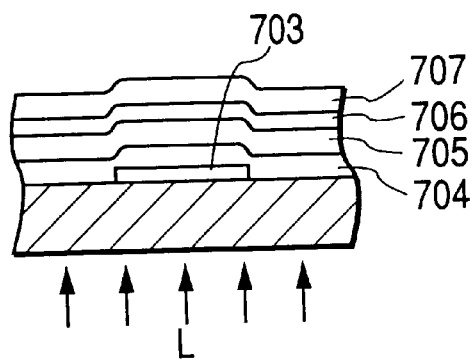
Figure 7D:
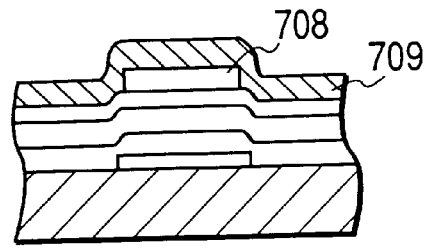
Figure 7E:
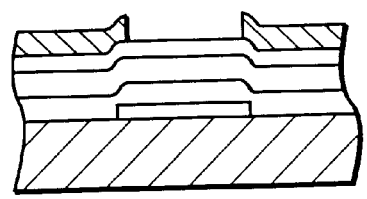
Figure 7F:
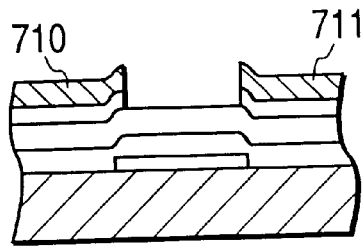

The charge generated in the lower MIS type photosensor S11 by light is stored through the thin film transistor T11 in storage capacitor C and thereafter the charge is read out by a reading circuit not illustrated. The overall structure of the image reading apparatus is as shown in FIG. 5.

An example of a detailed production method of the present embodiment will be specifically described referring to FIGS. 10A–10K. The following steps (a) to (k) each correspond to FIG. 10A to FIG. 10K, respectively.

(a) On glass substrate 301 after cleaned, chromium 302 is deposited in the thickness of 500 Å and then aluminum 303 in the thickness of 500 Å by sputtering, thus forming a first conductive layer. In the present embodiment the first conductive layer is of the double layer structure of chromium and aluminum. Selection of the metal materials at this time should be made, taking account of etch selectivities in subsequent patterning of a second conductive layer and in subsequent patterning of a third conductive layer.

(b) A positive photoresist is applied thereonto and the positive photoresist is patterned in a desired shape. Using this as a mask, the chromium/aluminum layer is etched; thereafter the positive photoresist is peeled off and the substrate is cleaned, thereby forming the lower electrodes 304 and storage capacitors (not illustrated) of the lower MIS type photosensors in the respective pixels and lower electrodes (not illustrated) of wiring portions.

(c) On this substrate a first hydrogenated amorphous silicon nitride layer 305 as an insulating layer is then formed in the thickness of 3000 Å by the plasma enhanced CVD using silane ($SiH_4$) gas, ammonia ($NH_3$) gas, and hydrogen ($H_2$) gas. Subsequently, an intrinsic (or substantially intrinsic) hydrogenated amorphous silicon layer 306 as a semiconductor layer is formed in the thickness of 2000 Å by the plasma enhanced CVD using silane ($SiH_4$) gas and hydrogen ($H_2$) gas. Further, a second hydrogenated amorphous silicon nitride layer 307 as a gate insulating film is deposited in the thickness of 3000 Å by the plasma enhanced CVD using silane ($SiH_4$) gas, ammonia ($NH_3$) gas, and hydrogen ($H_2$) gas.

(d) A photoresist pattern for contact holes and isolation is produced by photolithography and dry etching is carried out to remove parts of the first hydrogenated amorphous silicon nitride layer, intrinsic hydrogenated amorphous silicon layer, and second hydrogenated amorphous silicon nitride layer. Then the photoresist is peeled off and the substrate is cleaned, thereby achieving formation of contact holes (not illustrated) and isolation.

(e) Then a second conductive layer 308 is deposited using chromium by vapor deposition or sputtering. At this time, contact is made with the first conductive layer through the contact holes. A material for the second conductive layer is desirably one selectively left upon etching of the third conductive layer in a subsequent step. In this example, chromium is used, also taking account of the relation with the first conductive layer, but the material may be selected arbitrarily from any metals as long as attention is paid to the etch selectivities to the first conductive layer and to the third conductive layer.

(f) Subsequently, a positive photoresist is applied and the photoresist is patterned in a desired shape. Using this as a mask, the chromium layer is etched, and then the photoresist is peeled off. Then the substrate is cleaned, thereby producing the gate electrodes 309 of thin film transistors.

(g) Using this pattern of the second conductive layer as a mask, unnecessary portions of the second hydrogenated amorphous silicon nitride film 307 are removed by dry etching. (In the drawing numeral 310 designates the residual hydrogenated amorphous silicon nitride layer, which becomes the gate insulating film in this example.)

(h) Using the gate electrode pattern produced in the steps of (f) and (g) as a mask, the surface 311 of the intrinsic hydrogenated amorphous silicon layer except for the gate electrode pattern is converted into the $N^+$-type by plasma discharge P using phosphine ($PH_3$) gas and hydrogen ($H_2$) gas. In the present embodiment the surface is converted to the $N^+$-type which is an enhanced N-type. This is for improving the blocking property of hole and the ohmic property to electrons, and is not essential to the present invention. At this time the photoresist pattern produced in the step of (f) is left as it is, thereby making the shield perfect against the plasma. In the present embodiment, however, since the metal layer of chromium was already formed as gate electrodes and blocks the plasma, the photoresist may be peeled off after the step (g). The hydrogen ($H_2$) gas generates hydrogen radicals in the plasma and they promote microcrystallization of the surface layer. This microcrystallized surface is doped with phosphorus to be efficiently converted into the $N^+$-type. This $N^+$-type surface layer functions as parts of the source and drain electrodes of each thin film transistor and as a window layer and as an upper electrode (a blocking layer of hole) of each MIS sensor. Namely, in the present embodiment the photosensors are of the lower MIS type structure, and the light is incident from the opposite side to the metal layer, i.e., from this $N^+$ side. Considering absorption in this N-type portion, this portion should be constructed in as thin structure as possible. When this window layer is formed by the method of the present invention, the window layer can be formed in a very thin thickness, approximately 100 Å, and with sufficiently high conductivity. Almost perfect self-alignment type electrodes are formed as electrodes of thin film transistors.

(i) The third conductive layer 312 is then deposited in the thickness of 1 $\mu$m by vapor deposition or sputtering using aluminum.

(j) Subsequently, a positive resist is applied and the photoresist is patterned in a desired shape. Using this as a mask, the aluminum layer is etched; the photoresist is peeled off and the substrate is cleaned, thereby producing the source electrodes 313 and drain electrodes 314 of thin film transistors, the upper electrodes (not illustrated) of capacitors, and wirings (not illustrated). At this time, since chromium is used for the second conductive layer, only aluminum is selectively etched. Among the first conductive layer in parts of the contact holes and the wiring portions of the first conductive layer, aluminum exposed to the surface after isolation is etched at the same time on this occasion. However, since the first conductive layer is of the double layer structure of chromium and aluminum, even if the aluminum layer is etched herein, chromium remains as wiring, so that nothing is affected thereby. The structure of these first to third conductive layers is not limited to only the combination of the present embodiment, but it may be any structure as long as the etch selectivities during the steps are assured.

(k) Subsequently, a hydrogenated amorphous silicon nitride layer 315 is formed as a surface protective layer in the thickness of 6000 Å by the plasma enhanced CVD using silane ($SiH_4$) gas, ammonia ($NH_3$) gas, and hydrogen ($H_2$) gas.

The overlap widths $d_1$, $d_2$ between the gate electrode and the source/drain electrodes at this time were measured. The measurement results confirmed that the $N^+$-type portions constituted parts of the source and drain electrodes and that they were able to be formed in almost perfect self-aligning manner.

In the present embodiment the processes are as easy as those of the inverse stagger type. Namely, the source electrodes and drain electrodes can be formed without a step of lift-off or the like. As a result, cross-sectional configurations after formation of electrodes and the like are very excellent.

When the thin film transistors of the image reading apparatus are of the inverse stagger type structure from the need of process for the same layer structure as the photosensors, carriers must run up and down in the intrinsic hydrogenated amorphous silicon layer. In that case the resistance in this portion lowered the mobility of transistor. However, by employing the structure and production method of the present invention, it is easy to realize the coplanar type where the photosensors are of the lower MIS type and the thin film transistors are of the upper MIS type, so that the speed of thin film transistor can be increased.

In addition to that, use of the present invention further realized sufficiently good self-alignment of source electrode and drain electrode, though the steps were not so different much; and it thus permits us to produce the image reading apparatus with higher performance.

Further, the overlap widths between the source/drain electrode and the gate electrode were decreased, i.e., correct alignment was made by the gate electrodes; therefore, the margin, secured heretofore as estimating the deviation of mask alignment or the like, was able to be made very small in the present embodiment. This made designing of each pixel easier. Since the size of thin film transistor was decreased, the photosensor region was able to be increased, if the area was constant. This also contributed to increase in sensitivity. With the same sensitivity, the pixels were made smaller, so that the resolution was able to be enhanced. The parasitic capacitances of Cgs, Cds were used heretofore as read capacitors because of the limitation from the process, but the most of the Cgs, Cds capacitor components was eliminated in the present embodiment, which permitted us to freely design the read capacitors and increased degrees of freedom of designing. The present embodiment also made high-speed switching of thin film transistor possible, and made high-speed reading of the image reading apparatus itself possible.

Although the present embodiment was described as an example of the two-dimensional image reading apparatus, the present invention can also be applied to one-dimensional image reading apparatus without having to be limited to the two-dimensional image reading apparatus.

Since the present embodiment is of the type utilizing electrons in the semiconductor, the N-type layer is used to achieve blocking of hole and the ohmic property to electrons. If it is arranged to utilize holes, a P-type layer will be used to achieve blocking of electron and the ohmic property to holes. The present invention can also be applied to such cases.

Embodiment 2

Figure 11A:
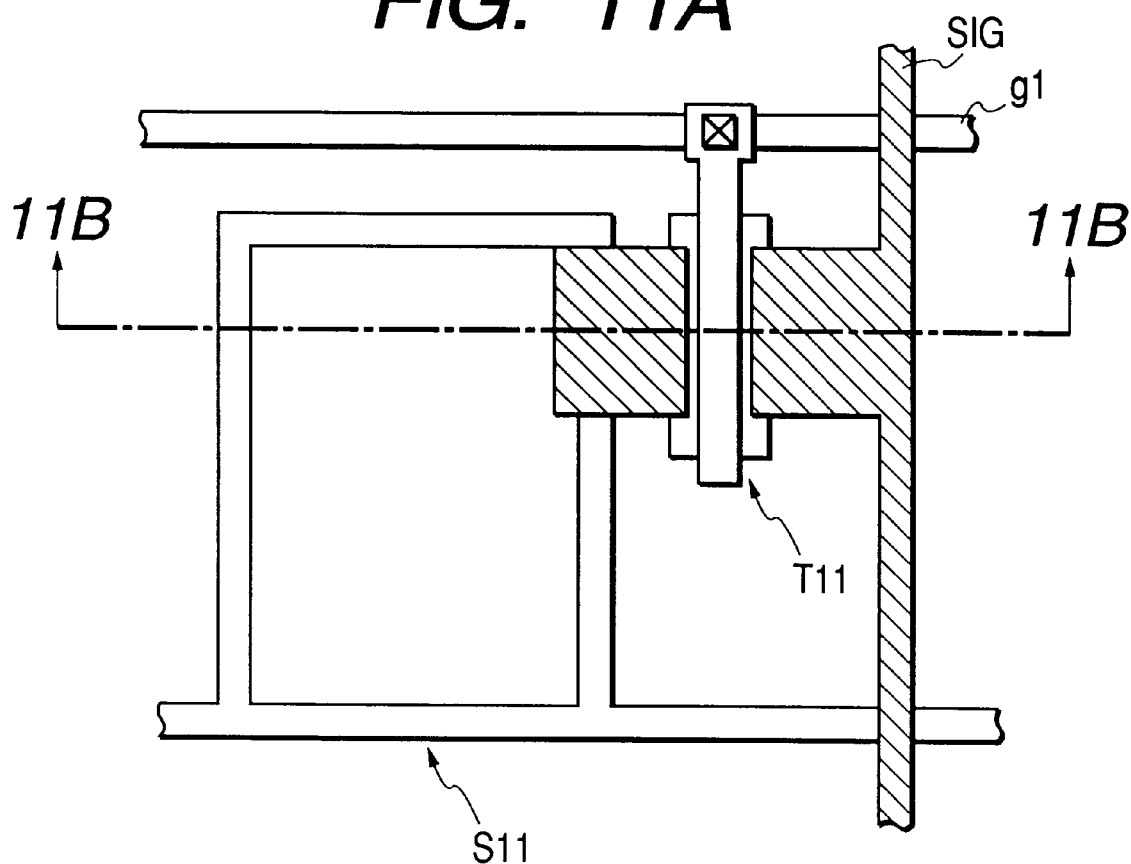
FIG. 11A is a schematic plan view for explaining an example of the structure of one pixel in a photoelectric conversion apparatus.
Figure 11B:
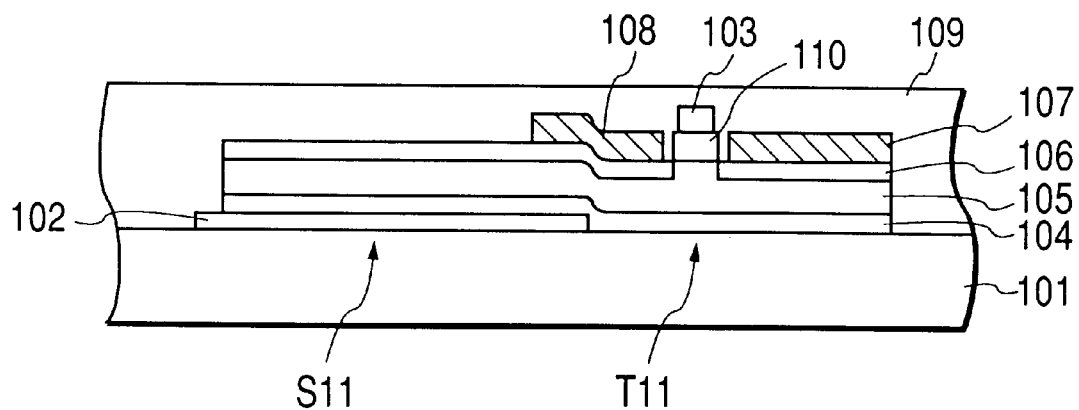
FIG. 11B is a schematic, cross-sectional view for explaining an example of the structure of one pixel in the photoelectric conversion apparatus.
Figure 12A:
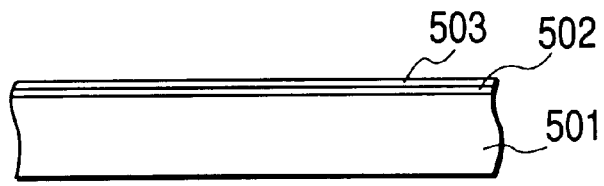
FIGS. 12A, 12B, 12C, 12D, 12E, 12F, 12G, 12H, 12I, 12J and 12K are schematic, cross-sectional views for explaining an example of production steps of the photoelectric conversion apparatus.
Figure 12B:
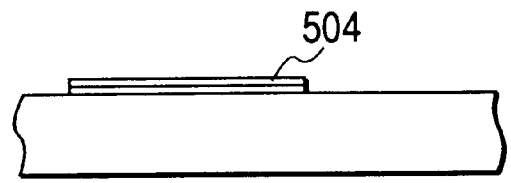
Figure 12C:
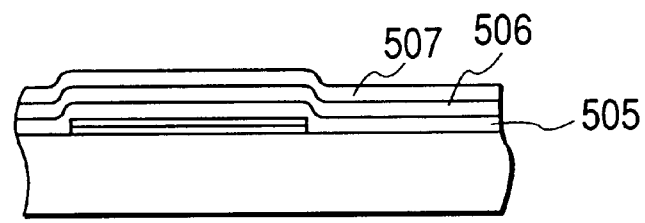
Figure 12D:
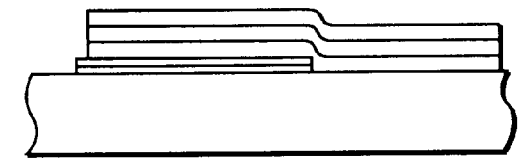
Figure 12E:
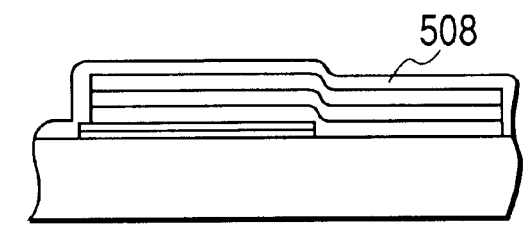
Figure 12F:
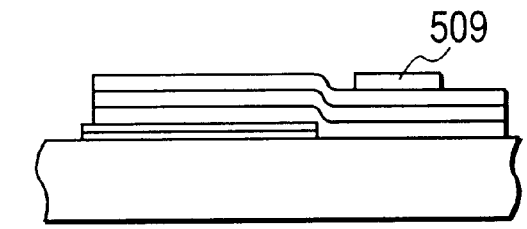
Figure 12G:
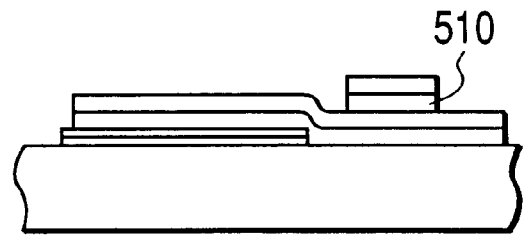
Figure 12H:
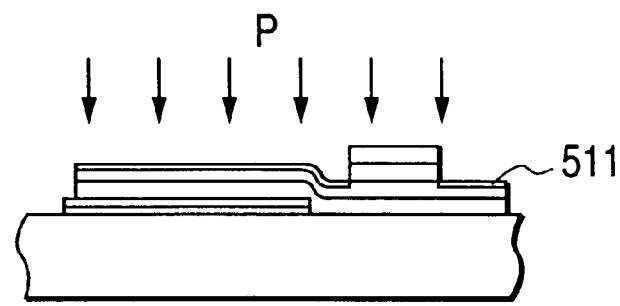
Figure 12I:
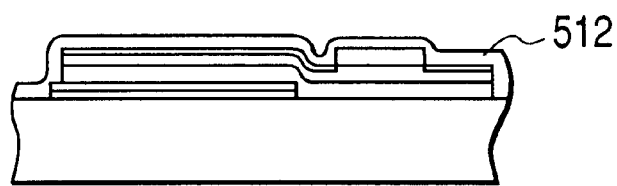
Figure 12J:
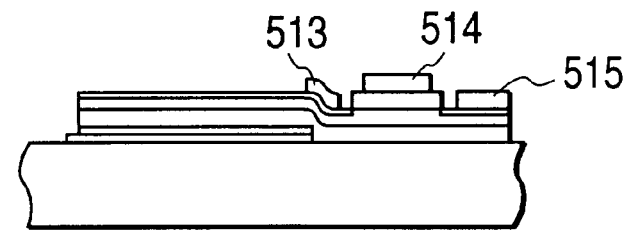
Figure 12K:
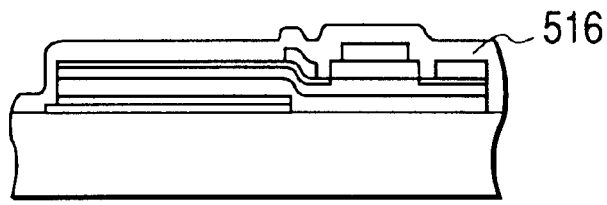

An example of the two-dimensional image reading apparatus will be described as a thin film semiconductor apparatus of the present invention. FIG. 11A is a schematic plan view of one pixel of the image reading apparatus according to the present invention. FIG. 11B is a schematic, cross-sectional view along 11B—11B of FIG. 11A. The present embodiment is an example in which the order of formation of the upper electrodes is changed from that in the image reading apparatus in Embodiment 1. The overall structure of the image reading apparatus is the same as that of the example shown in FIG. 5.

A detailed production method of the present embodiment will be specifically described referring to FIGS. 12A–12K. The following steps (a) to (k) correspond to FIG. 12A to FIG. 12K, respectively.

(a) On glass substrate 501 after cleaned, chromium 502 is deposited in the thickness of 500 Å and then aluminum 503 in the thickness of 500 Å by sputtering. The present embodiment employs the first conductive layer of the double layer structure of chromium and aluminum, but the first conductive layer may be either a single chromium layer or a single aluminum layer as described hereinafter. The present embodiment intentionally adopts the double layer structure in order to increase the yield of the lower electrodes. It is, however, noted that the double layer structure is not a necessary condition.

(b) A positive photoresist is applied thereonto and the positive photoresist is patterned in a desired shape. Using this as a mask, the chromium/aluminum layer is etched; thereafter the positive photoresist is peeled off and the substrate is cleaned, thereby forming the lower electrodes 504 and storage capacitors (not illustrated) of the lower MIS type photosensors in the respective pixels and the lower electrodes (not illustrated) of wiring portions.

(c) On this substrate a hydrogenated amorphous silicon nitride layer 505 is then formed in the thickness of 3000 Å by the plasma enhanced CVD using silane ($SiH_4$) gas, ammonia ($NH_3$) gas, and hydrogen ($H_2$) gas. Subsequently, an intrinsic (or substantially intrinsic) hydrogenated amorphous silicon layer 506 is formed in the thickness of 2000 Å by the plasma enhanced CVD using silane ($SiH_4$) gas and hydrogen ($H_2$) gas. Further, a hydrogenated amorphous silicon nitride layer 507 is deposited in the thickness of 3000 Å by the plasma enhanced CVD using silane ($SiH_4$) gas, ammonia ($NH_3$) gas, and hydrogen ($H_2$) gas.

(d) A photoresist pattern for contact holes and isolation is produced by photolithography and dry etching is carried out to remove parts of the first hydrogenated amorphous silicon nitride layer, intrinsic hydrogenated amorphous silicon layer, and second hydrogenated amorphous silicon nitride layer. Then the photoresist is peeled off and the substrate is cleaned, thereby achieving formation of contact holes and isolation.

(e) Subsequently, the substrate is coated with a positive resist 508.

(f) Then a pattern 509 of the photoresist is made in a desired shape.

(g) Using this pattern as a mask, unnecessary portions of the second hydrogenated amorphous silicon nitride film are removed by dry etching. A pattern at this time becomes the shape 510 of gate insulating film.

(h) Using the gate insulating film pattern produced in the steps of (e), (f), and (g) as a mask, the surface of the intrinsic hydrogenated amorphous silicon layer except for the gate insulating film pattern is converted into the $N^+$-type by plasma discharge P using phosphine ($PH_3$) gas and hydrogen ($H_2$) gas. In the present embodiment the surface is converted to the $N^+$-type which is an enhanced N-type from the same reason as in Embodiment 1. At this time the photoresist pattern produced in the step of (f) is left as it is, thereby making the shield perfect against the plasma. The hydrogen ($H_2$) gas generates hydrogen radicals in the plasma and they promote microcrystallization of the surface layer. This microcrystallized surface is doped with phosphorus to be efficiently converted into the $N^+$-type. This $N^+$-type surface layer functions as parts of the source and drain electrodes of each thin film transistor and as a window layer and as an upper electrode (a blocking layer of hole) of each lower MIS photosensor. Namely, in the present embodiment the photosensors are of the lower MIS type structure, and the light is incident from the opposite side to the metal layer, i.e., from this $N^+$ side. Considering absorption in this $N^+$-type portion, this portion should be constructed in as thin structure as possible. When this window layer is formed by the method of the present invention, the window layer can be formed in a very thin thickness, approximately 100 Å, and with sufficiently high conductivity. Almost perfect self-alignment type electrodes are formed as electrodes of thin film transistors.

(i) After this photoresist is peeled off, a second conductive layer 512 is deposited using aluminum by vapor deposition or sputtering. At this time contact is made through contact holes with the first electrode layer.

(j) After that, a positive resist is applied and the photoresist is patterned in a desired shape. Using this as a mask, the aluminum layer is etched; the photoresist is peeled off and the substrate is cleaned, thereby producing the gate electrodes 514, source electrodes 513, and drain electrodes 515 of thin film transistors, the upper electrodes of capacitors, and wirings.

(k) Subsequently, a hydrogenated amorphous silicon nitride layer 516 is formed as a surface protective layer in the thickness of 6000 Å by the plasma enhanced CVD using silane ($SiH_4$) gas, ammonia ($NH_3$) gas, and hydrogen ($H_2$) gas.

In the present embodiment, since the surface of the intrinsic hydrogenated amorphous silicon layer is converted to the $N^+$-type with the photoresist pattern as a mask, it becomes possible to form the gate electrodes, source electrodes, drain electrodes, wirings, upper electrodes, etc. by a set of deposition and patterning of metal layer. Namely, the third conductive layer does not have to be produced. As a result, the numbers of photolithography steps and deposition steps are one smaller than those in Embodiment 1, so that the thin film semiconductor apparatus can be realized at lower cost. In the present embodiment the first conductive layer was made of chromium and aluminum, but it can be a single metal layer. In this case the same metal can be used for the first conductive layer and the second conductive layer, which is preferable, because the apparatus loads upon production and the like are decreased.

In the present embodiment, since the metal layer of the gate electrodes and the source/drain electrodes is produced at one time, the gate electrode portions are formed slightly inside of the gate insulating portions. Therefore, the overlap widths $d_1$, $d_2$ are 0 or less; rather, the electrodes do not overlap with each other in many cases.

The present embodiment realized easy processes closer to those of the inverse stagger type. In the present embodiment the source electrodes and drain electrodes can be formed without a step of lift-off or the like, as in Embodiment 1. As a result, the cross-sectional configurations after formation of electrodes etc. are very excellent.

In other words, the present embodiment can provide the high-performance semiconductor apparatus having the simpler structure than and similarly excellent characteristics to that of Embodiment 1.

Embodiment 3

The present embodiment shows an example using polysilicon (polycrystalline silicon) for at least a part of thin film transistor and hydrogenated amorphous silicon for at least a part of photosensor.

Figure 13A:
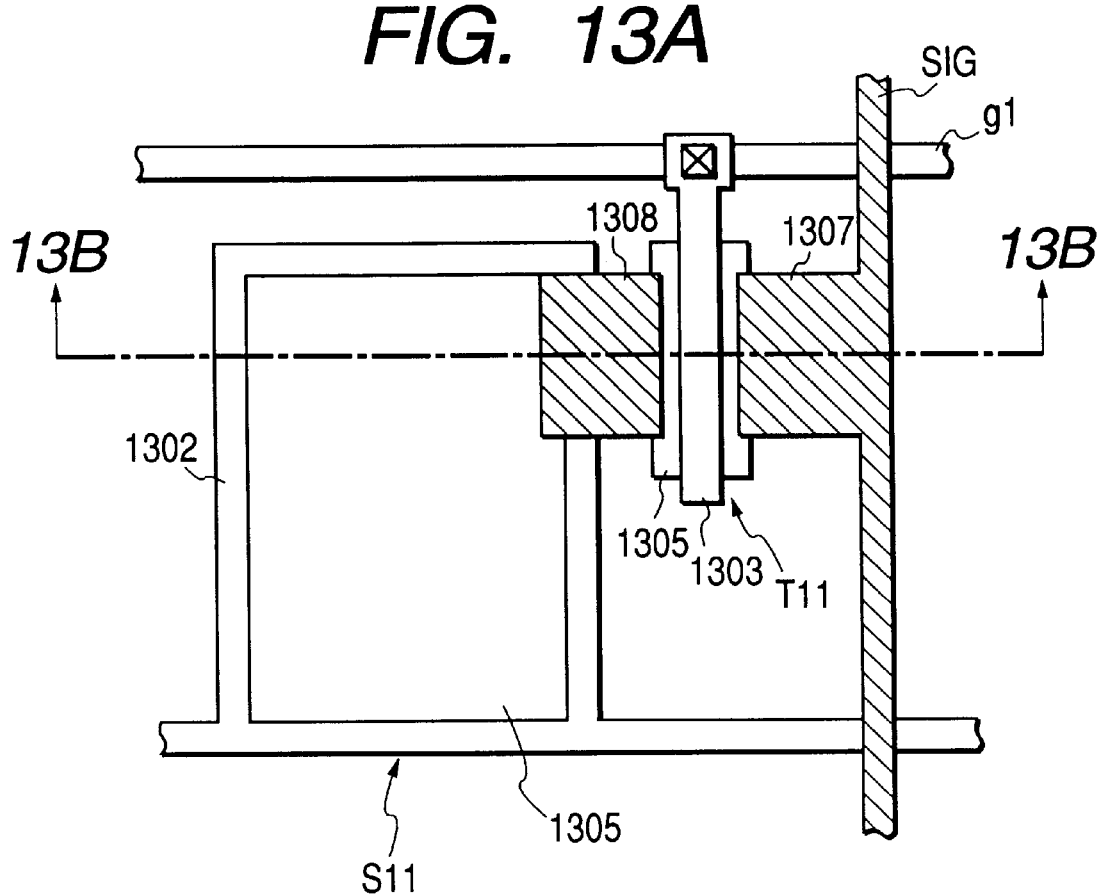
FIG. 13A is a schematic plan view for explaining an example of the structure of one pixel in a photoelectric conversion apparatus.
Figure 13B:
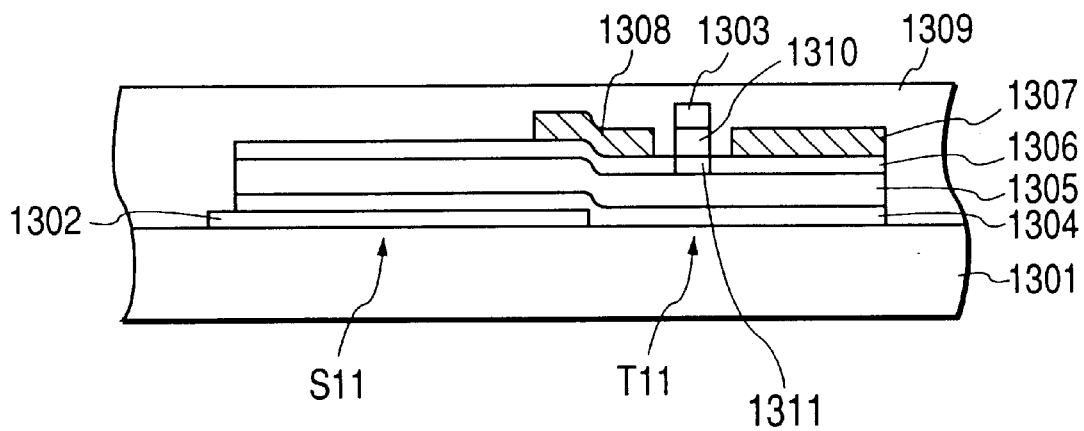
FIG. 13B is a schematic, cross-sectional view for explaining an example of the structure of one pixel in the photoelectric conversion apparatus.
Figure 14A:
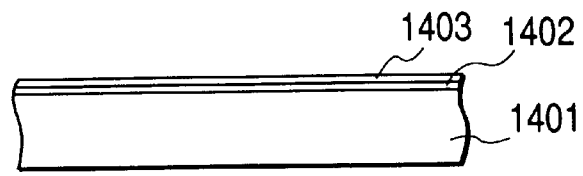
FIGS. 14A, 14B, 14C, 14D, 14E, 14F, 14G, 14H, 14I, 14J, 14K, 14L and 14M are schematic, cross-sectional views for explaining an example of production steps of the photoelectric conversion apparatus.
Figure 14B:
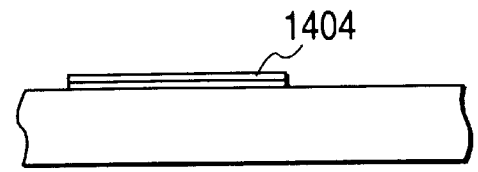
Figure 14C:
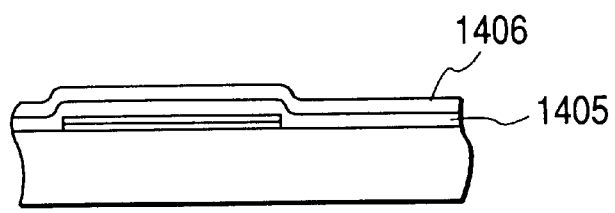
Figure 14D:
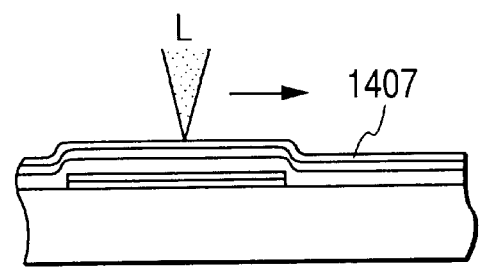
Figure 14E:
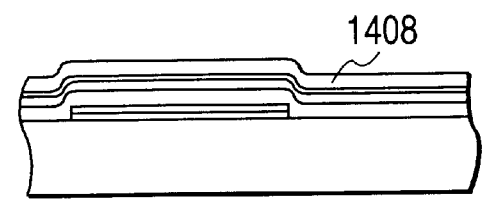
Figure 14F:
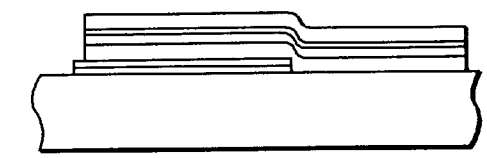
Figure 14G:
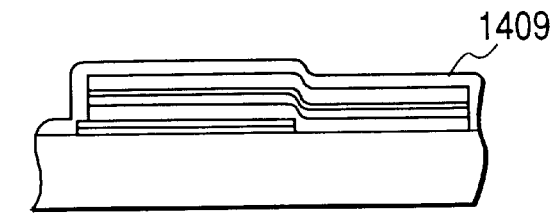
Figure 14H:
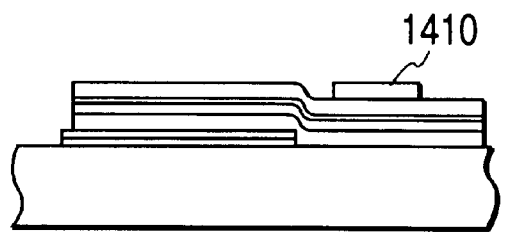
Figure 14I:
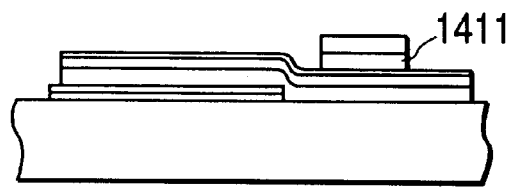
Figure 14J:
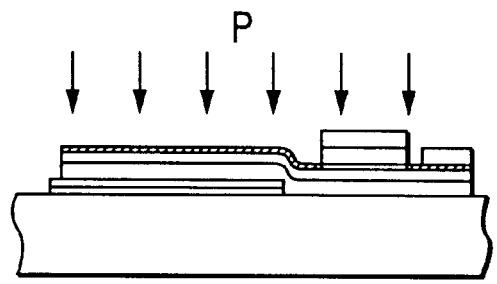
Figure 14K:
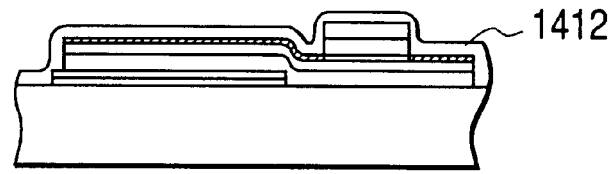
Figure 14L:
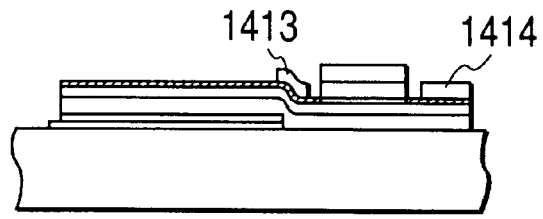
Figure 14M:
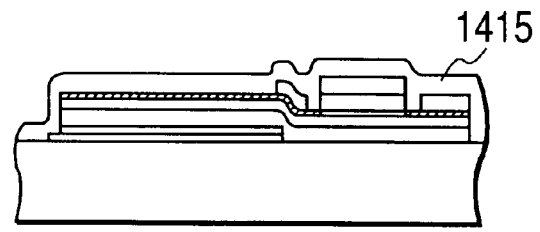

FIG. 13A is a schematic plan view of one pixel of the image reading apparatus according to the present invention. FIG. 13B is a schematic, cross-sectional view along 13B—13B of FIG. 13A. As illustrated, the present example also has a photoelectric conversion element S11 of the lower MIS type (lower metal electrode type) and a thin film transistor T11 of the upper MIS type (upper gate electrode type) for transmission of signal in one pixel.

In the drawings, numeral 1301 denotes a substrate, 1302 a lower electrode of the photoelectric conversion element, 1303 a gate electrode, 1304 an insulating layer, 1305 a semiconductor layer, 1306 an ohmic layer, 1307 a drain electrode, 1308 a source electrode, 1309 a protective layer, and 1310 a gate insulating film. Numeral 1311 designates a polycrystalline semiconductor layer.

A detailed production method of the present embodiment will be specifically described referring to FIG. 14A to FIG. 14M. The following steps (a) to (m) correspond to FIG. 14A to FIG. 14M, respectively.

(a) On glass substrate 1401 after cleaned, chromium 1402 is deposited in the thickness of 500 Å and then aluminum 1403 in the thickness of 500 Å by sputtering, thus forming a first conductive layer. In the present embodiment the first conductive layer is of the double layer structure of chromium and aluminum. Selection of the metal materials at this time should be made, preferably taking account of etch selectivities in subsequent patterning of a second conductive layer and in subsequent patterning of a third conductive layer.

(b) A positive photoresist is applied thereonto and the positive photoresist is patterned in a desired shape. Using this as a mask, the chromium/aluminum layer is etched; thereafter the positive photoresist is peeled off and the substrate is cleaned, thereby forming the lower electrodes 1404 and storage capacitors (not illustrated) of the lower MIS type photosensors in the respective pixels and the lower electrodes (not illustrated) of wiring portions.

(c) On this substrate a hydrogenated amorphous silicon nitride layer 1405 as an insulating layer is then formed in the thickness of 3000 Å by the plasma enhanced CVD using silane ($SiH_4$) gas, ammonia ($NH_3$) gas, and hydrogen ($H_2$) gas. Subsequently, an intrinsic (or substantially intrinsic) hydrogenated amorphous silicon layer 1406 as a semiconductor layer is formed in the thickness of 5000 Å by the plasma enhanced CVD using silane ($SiH_4$) gas and hydrogen ($H_2$) gas.

(d) Then the surface of the intrinsic hydrogenated amorphous silicon layer is crystallized using the XeCl excimer laser, for forming a polycrystalline layer. In the present embodiment light from a laser source is changed to a line of light L by a homogenizer and the entire surface 1407 of the surface layer is polycrystallized by scan with the light. The irradiation intensity is 200 mJ/cm$^2$ and the thickness of the polycrystalline layer at this time is 1000 Å, which is the thickness enough to function as a channel layer of thin film transistor. The method according to the present embodiment is very convenient in that, since the thin film transistors are of the upper gate structure, even if the thickness of the hydrogenated amorphous silicon layer is large, only the surface layer can be polycrystallized and this portion can be utilized for the channels. Since the thickness of the hydrogenated amorphous silicon layer cannot be decreased below a certain level in view of the sensitivity of photosensor, the method according to the present invention is advantageous.

In the present embodiment the surface of the intrinsic hydrogenated amorphous silicon layer was crystallized using the XeCl excimer laser, but the method of crystallization may be any method of crystallization suitable for the step of the present invention, e.g., a laser of more suitable wavelength and energy.

(e) Subsequently, a hydrogenated amorphous silicon nitride layer 1408 as a gate insulating film is deposited in the thickness of 3000 Å by the plasma enhanced CVD using silane ($SiH_4$) gas, ammonia ($NH_3$) gas, and hydrogen ($H_2$) gas.

(f) A photoresist pattern for contact holes and isolation is produced by photolithography and dry etching is carried out to remove parts of the first hydrogenated amorphous silicon nitride layer, the intrinsic hydrogenated amorphous silicon layer including the crystallized surface layer, and the second hydrogenated amorphous silicon nitride layer. Then the photoresist is peeled off and the substrate is cleaned, thereby achieving formation of contact holes (not illustrated) and isolation.

(g) Then a second conductive layer 1409 to become the gate electrodes is deposited using chromium by sputtering. At this time, contact is made between the first conductive layer and the second conductive layer through the contact holes. The material for the second conductive layer is preferably selected as one selectively left without being affected upon etching of the third conductive layer in a subsequent step. In this embodiment, chromium is used, also taking account of the relation with the first conductive layer, but the material may be selected arbitrarily from any metals as long as attention is paid to the etch selectivities to the first conductive layer and to the third conductive layer. Namely, the materials should be selected based on such criteria that the first conductive layer does not suffer fatal influence during etching of the second conductive layer and that the first conductive layer and second conductive layer do not suffer fatal influence during etching of the third conductive layer.

(h) Subsequently, a positive photoresist is applied and the photoresist is patterned in a desired shape. Using this as a mask, the chromium layer is etched, and then the photoresist is peeled off. Then the substrate is cleaned, thereby producing the gate electrodes 1410 of thin film transistors. The first conductive layer is of the double layer structure of chromium and aluminum, wherein the outermost surface is aluminum. This protects the first conductive layer from damage during etching of the second conductive layer.

(i) Using this pattern of the second conductive layer as a mask, unnecessary portions of the second hydrogenated amorphous silicon nitride film are removed by dry etching (numeral 1411 designates the residual hydrogenated amorphous silicon nitride layer, which becomes a gate insulating film in this example). At the same time, 800 Å is etched out of 1000 Å of the polycrystallized surface of the intrinsic hydrogenated amorphous silicon layer. Since this polycrystallized portion will become a window layer of sensor portion in a subsequent step, the residual film of the polycrystallized layer is set to 200 Å for the purpose of suppressing absorption of light in this portion.

(j) Using the gate electrode pattern produced in the steps of (g) and (h) as a mask, the polycrystallized surface 1407 of the intrinsic hydrogenated amorphous silicon layer except for the gate electrode pattern is converted into the N$^+$-type by plasma discharge P using phosphine ($PH_3$) gas and hydrogen ($H_2$) gas. In the present embodiment the surface is converted to the N$^+$-type which is an enhanced N-type. This is for improving the blocking property of hole and the ohmic property to electrons, and is not essential to the present invention.

At this time the photoresist pattern produced in the step of (g) is left as it is, thereby making the shield perfect against the plasma. In the present embodiment, however, since the metal layer of chromium was already formed as gate electrodes and blocks the plasma, the photoresist may be peeled off after the step (h). The hydrogen ($H_2$) gas generates hydrogen radicals in the plasma and they promote microcrystallization of the surface layer. This microcrystallized surface is doped with phosphorus to be efficiently converted into the $N^+$-type. In the present embodiment, since this $N^+$-type-converted portion was already polycrystallized in the step (d), this portion is able to be converted more efficiently into the $N^+$-type. This $N^+$-type surface layer functions as parts of the source and drain electrodes of each thin film transistor and as a window layer and as an upper electrode (a blocking layer of hole) of each MIS sensor. Namely, in the present embodiment the photosensors are of the lower MIS type structure, and the light is incident from the opposite side to the metal layer, i.e., from this $N^+$ side. Considering absorption in this $N^+$-type portion, this portion should be constructed in as thin structure as possible.

When this window layer is formed by the method of the present invention, the window layer can be formed in a very thin thickness, approximately 200 Å, and with sufficiently high conductivity. Almost perfect self-alignment type electrodes are formed as electrodes of thin film transistors.

(j) The third conductive layer 1412 is then deposited in the thickness of 1 μm using aluminum by vapor deposition or sputtering, for forming the source and drain electrodes etc.

(k) Subsequently, a positive resist is applied and the photoresist is patterned in a desired shape. Using this as a mask, the aluminum layer is etched; the photoresist is peeled off and the substrate is cleaned, thereby producing the source electrodes 1413 and drain electrodes 1414 of thin film transistors, the upper electrodes (not illustrated) of capacitors, and wirings (not illustrated). At this time, since chromium is used for the second conductive layer, only aluminum is selectively etched. Among the first conductive layer in parts of the contact holes and the wiring portions of the first conductive layer, aluminum exposed to the surface after isolation is etched at the same time on this occasion. However, since the first conductive layer is of the double layer structure of chromium and aluminum, even if the aluminum layer is etched herein, chromium remains as wiring, so that nothing is affected thereby. The structure of these first to third conductive layers is not limited to only the combination of the present embodiment, but it may be any structure as long as the etch selectivities during the steps are assured.

(l) Subsequently, a hydrogenated amorphous silicon nitride layer 1415 is formed as a surface protective layer in the thickness of 6000 Å by the plasma enhanced CVD using silane ($SiH_4$) gas, ammonia ($NH_3$) gas, and hydrogen ($H_2$) gas.

The overlap widths $d_1$, $d_2$ between the gate electrode and the source/drain electrode at this time were measured. The measurement results confirmed that the $N^+$-type portions constituted parts of the source and drain electrodes and that they were able to be formed in almost perfect self-aligning manner.

In the present embodiment according to the present invention, the source and drain electrodes can be formed by the easy processes comparable to those of the inverse stagger type without a step of lift-off or the like. As a result, the cross-sectional configurations after formation of electrodes and the like are very excellent.

In the present embodiment, the production step by the self-alignment of the source and drain electrodes of thin film transistors may involve conversion to the $N^+$-type by plasma with a photoresist as a mask as in the steps (e)–(h) of Embodiment 2.

Further, when the second insulating layer is patterned with a photoresist, the wiring portions and the gate electrodes of thin film transistors may be produced simultaneously, using a metal such as chromium for the second conductive layer. In this case, taking account of the wiring resistance, it is better to form the first conductive layer of aluminum/chromium and the second layer of aluminum. This eliminates the steps of forming the third conductive layer and patterning it, thus further simplifying the process and thus enhancing the cost performance.

The present embodiment can enhance the various characteristics including the switching characteristics of thin film transistor more by polycrystallization and can optimize the photosensitive characteristics of photoelectric conversion element section by use of amorphous silicon. This realized higher-speed operation and enhanced adaptability to capturing of moving picture information more, in addition to the aforementioned effects.

Although the present embodiment was described an example of the two-dimensional image reading apparatus, the present invention can also be applied to one-dimensional image reading apparatus without having to be limited to the two-dimensional image reading apparatus.

Since the present embodiment is of the type utilizing electrons in the semiconductor, the $N^+$-type layer is used to achieve blocking of hole and the ohmic property to electrons. If it is arranged to utilize holes, a P-type layer will be used to achieve blocking of electron and the ohmic property to holes.

In other words, since the channel portions of thin film transistors are crystallized in the present embodiment, the mobility of hole is also improved drastically and the present embodiment can thus effectively realize the form of utilizing the holes.

What is claimed is:

1. A thin film semiconductor apparatus comprising a photoelectric conversion element having a, first electrode, an insulating layer, a semiconductor layer, and a second electrode in the stated order on a substrate; and a thin film transistor having a semiconductor layer, a pair of ohmic contact layers disposed with a space on the semiconductor layer, source and drain electrodes provided in contact with the respective ohmic contact layers, and a gate electrode provided through a second insulating layer in the space.

2. A thin film semiconductor apparatus comprising a photoelectric conversion element having a first electrode, an insulating layer, a semiconductor layer, and a second electrode in the stated order on a substrate; and a thin film transistor having a semiconductor layer on an insulating layer provided on the substrate, a pair of ohmic contact layers disposed with a space on the semiconductor layer, source and drain electrodes provided in contact with the respective ohmic contact layers, and a gate electrode provided through a second insulating layer in the space.

3. The apparatus according to claim 1, wherein the second electrode comprises an ohmic contact layer.

4. The apparatus according to claim 1, wherein the semiconductor layer of the photoelectric conversion element and the semiconductor layer of the thin film transistor are a common semiconductor layer.

5. The apparatus according to claim 1, wherein the semiconductor layer of the thin film transistor extends from the semiconductor layer of the photoelectric conversion element.

6. The apparatus according to claim 2, wherein the insulating layer of the photoelectric conversion element and the insulating layer of the thin film transistor are a common insulating layer.

7. The apparatus according to claim 2, wherein the insulating layer of the thin film transistor extends from the insulating layer of the photoelectric conversion element.

8. The apparatus according to claim 1, wherein a width of the second insulating layer of the thin film transistor is equal to or wider than a width of the gate electrode.

9. The apparatus according to claim 1, wherein the second insulating layer is provided on a second semiconductor formed on the semiconductor layer.

10. The apparatus according to claim 9, wherein the second semiconductor is a polycrystalline semiconductor.

11. The apparatus according to claim 9, wherein the semiconductor layer is an amorphous semiconductor and the second semiconductor is a polycrystalline semiconductor.

12. The apparatus according to claim 3, wherein the ohmic contact layer comprises an impurity capable of controlling a conduction type of semiconductor.

13. The apparatus according to claim 1, wherein the second electrode of the photoelectric conversion element is electrically connected with one of the source and drain electrodes of the thin film transistor.

14. The apparatus according to claim 1, wherein the second electrode of the photoelectric conversion element extends from the ohmic contact layer of the thin film transistor.

15. The apparatus according to claim 1, wherein the first electrode of the photoelectric conversion element is electrically connected with one of the source and drain electrodes of the thin film transistor.

* * * * *

UNITED STATES PATENT AND TRADEMARK OFFICE
CERTIFICATE OF CORRECTION

PATENT NO. : 5,990,489
DATE : November 23, 1999
INVENTOR(S): KAZUAKI TASHIRO

Page 1 of 3

It is certified that error appears in the above-identified patent and that said Letters Patent is hereby corrected as shown below:

COLUMN 1:

Line 48, "of" should read --of the--; and
    Line 50, "form" should read --form an--.

COLUMN 2:

Line 41, "of" should read --of a--.

COLUMN 3:

Line 13, "recombined" should read --recombined (annihilate)--; and
    Line 16, "to annihilate" should be deleted.

COLUMN 4:

Line 10, "clean" should read --a clean--; and "cleaned," should read --being cleaned,--.

COLUMN 5:

Line 23, "with" should read --with a--.

COLUMN 6:

Line 4, "of" should read --of the--; and
    Line 33, "kept" should be deleted.

COLUMN 7:

Line 3, "moving" should read --a moving--.

UNITED STATES PATENT AND TRADEMARK OFFICE
CERTIFICATE OF CORRECTION

PATENT NO. : 5,990,489

DATE : November 23, 1999

INVENTOR(S): KAZUAKI TASHIRO

Page 2 of 3

It is certified that error appears in the above-identified patent and that said Letters Patent is hereby corrected as shown below:

COLUMN 10:

Line 11, "cleaned," should read --cleaning,--.

COLUMN 11:

Line 12, "hole" should read --the holes--;
Line 26, "hole" should read --the holes--;
Line 42, "etched;" should read --etched,-- and
Line 43, "off" should read --off,--.

COLUMN 12:

Line 15, "of" should read --of the--;
Line 24, "much" should be deleted;
Line 39, "the most" should read --most--; and "was" should read --were--; and
Line 56, "holes." should read --the holes.--.

COLUMN 13:

Line 9, "cleaned," should read --being cleaned,--.

COLUMN 14:

Line 5, "hole)" should read --the holes)--.

COLUMN 15:

Line 22, "cleaned," should read --being cleaned,--;
Line 55, "scan" should read --scanning--;
Line 57, "the" should be deleted;
Line 58, "thickness" should read --thick--; and
Line 66, "of" should read --of the--.

UNITED STATES PATENT AND TRADEMARK OFFICE
CERTIFICATE OF CORRECTION

PATENT NO. : 5,990,489
DATE : November 23, 1999
INVENTOR(S): KAZUAKI TASHIRO

It is certified that error appears in the above-identified patent and that said Letters Patent is hereby corrected as shown below:

<u>COLUMN 17</u>:

Line 19, "hole)" should read --the holes)--.

<u>COLUMN 18</u>:

Line 46, "a," should read --a--.

Signed and Sealed this

Twenty-seventh Day of March, 2001

Attest:

NICHOLAS P. GODICI

Attesting Officer     Acting Director of the United States Patent and Trademark Office